(12) United States Patent
Lee

(10) Patent No.: US 10,818,372 B2
(45) Date of Patent: Oct. 27, 2020

(54) TEST MODES FOR A SEMICONDUCTOR MEMORY DEVICE WITH STACKED MEMORY CHIPS USING A CHIP IDENTIFICATION

(71) Applicant: SK hynix Inc., Icheon-si, Gyeonggi-do (KR)

(72) Inventor: Seong Ju Lee, Hwaseong-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/184,783

(22) Filed: Nov. 8, 2018

(65) Prior Publication Data

US 2019/0311774 A1    Oct. 10, 2019

(30) Foreign Application Priority Data

Apr. 10, 2018  (KR) .................. 10-2018-0041456

(51) Int. Cl.
| | |
|---|---|
| *G11C 29/38* | (2006.01) |
| *H01L 25/065* | (2006.01) |
| *H01L 23/49* | (2006.01) |
| *H01L 23/48* | (2006.01) |
| *H01L 25/18* | (2006.01) |

(52) U.S. Cl.
CPC ............ *G11C 29/38* (2013.01); *H01L 23/481* (2013.01); *H01L 23/49* (2013.01); *H01L 25/0657* (2013.01); *H01L 25/18* (2013.01)

(58) Field of Classification Search
None
See application file for complete search history.

(56) References Cited

U.S. PATENT DOCUMENTS

| | | | | |
|---|---|---|---|---|
| 5,502,667 A | * | 3/1996 | Bertin ................. | G11C 5/04 257/686 |
| 7,449,909 B2 | | 11/2008 | Ma et al. | |
| 2004/0257847 A1 | * | 12/2004 | Matsui ................. | G11C 5/00 365/63 |
| 2007/0058410 A1 | * | 3/2007 | Rajan ................. | G11C 5/02 365/63 |
| 2007/0189049 A1 | * | 8/2007 | Djordjevic .............. | G11C 5/04 365/51 |

(Continued)

FOREIGN PATENT DOCUMENTS

| | | |
|---|---|---|
| KR | 1020080069778 A | 7/2008 |
| KR | 101223540 B1 | 1/2013 |
| KR | 1020170024661 A | 3/2017 |

*Primary Examiner* — J. H. Hur
(74) *Attorney, Agent, or Firm* — William Park & Associates Ltd.

(57) ABSTRACT

A semiconductor system includes a first semiconductor device and a second semiconductor device. The first semiconductor device controls a test mode. The first semiconductor device outputs a chip identification and receives external data. The second semiconductor device includes a plurality of memory chips. At least one of the plurality of memory chips are activated based on the chip identification to store input data into each of the plurality of memory chips that have been activated while a write operation is performed in the test mode. At least two of the plurality of memory chips are activated based on the chip identification to output the stored input data as the external data while a read operation is performed in the test mode.

8 Claims, 15 Drawing Sheets

(56) References Cited

U.S. PATENT DOCUMENTS

| | | | |
|---|---|---|---|
| 2009/0059641 A1* | 3/2009 | Jeddeloh | H01L 23/481 365/63 |
| 2011/0084722 A1* | 4/2011 | Nishioka | G11C 5/02 324/762.01 |
| 2012/0134193 A1* | 5/2012 | Ide | H01L 23/481 365/51 |
| 2012/0140577 A1* | 6/2012 | Kim | G11C 29/26 365/189.07 |
| 2017/0053711 A1* | 2/2017 | Shibata | G11C 29/12015 |

* cited by examiner

FIG. 9

| ACTIVATED MEMORY CHIP | CID<3> | CID<2> | CID<1> | SCON<1> | SCON<2> | SCON<3> | SCON<4> | MCON<1> | MCON<2> | MCON<3> | MCON<4> |
|---|---|---|---|---|---|---|---|---|---|---|---|
| MC1 | L | L | L | H | H | L | L | H | H | H | H |
| MC2 | L | L | H | L | L | H | H | L | L | L | L |
| MC3 | L | H | L | H | H | L | L | L | L | L | L |
| MC4 | L | H | H | L | L | H | H | L | L | L | L |
| MC5 | H | L | L | H | H | H | L | H | H | H | H |
| MC6 | H | L | H | L | L | L | H | L | L | L | L |
| MC7 | H | H | L | H | H | L | L | L | L | L | L |
| MC8 | H | H | H | L | L | H | H | L | L | L | L |

FIG. 11

| ACTIVATED MEMORY CHIP | CID<3> | CID<2> | CID<1> | SCON<1> | SCON<2> | SCON<3> | SCON<4> | MCON<1> | MCON<2> | MCON<3> | MCON<4> |
|---|---|---|---|---|---|---|---|---|---|---|---|
| MC1 | L | L | L | H | H | L | L | H | H | H | H |
| MC2 | L | L | H | H | H | L | L | L | L | L | L |
| MC3 | L | H | L | L | L | H | H | L | L | L | L |
| MC4 | L | H | H | L | L | H | H | L | H | L | L |
| MC5 | H | L | L | H | H | L | L | H | H | H | H |
| MC6 | H | L | H | H | H | L | L | L | L | L | L |
| MC7 | H | H | L | L | L | H | H | L | L | L | L |
| MC8 | H | H | H | L | L | H | H | L | L | L | L |

FIG. 13

| ACTIVATED MEMORY CHIP | CID<3> | CID<2> | CID<1> | SCON<1> | SCON<2> | SCON<3> | SCON<4> | MCON<1> | MCON<2> | MCON<3> | MCON<4> |
|---|---|---|---|---|---|---|---|---|---|---|---|
| MC1 | L | L | L | H | H | H | H | H | H | L | L |
| MC2 | L | L | H | H | H | H | H | L | L | L | L |
| MC3 | L | H | L | H | H | H | H | L | L | L | L |
| MC4 | L | H | H | H | H | H | H | L | L | L | L |
| MC5 | H | L | L | H | H | H | H | L | L | H | H |
| MC6 | H | L | H | H | H | H | H | L | L | L | L |
| MC7 | H | H | L | H | H | H | H | L | L | L | L |
| MC8 | H | H | H | H | H | H | H | L | L | L | L |

TEST MODES FOR A SEMICONDUCTOR MEMORY DEVICE WITH STACKED MEMORY CHIPS USING A CHIP IDENTIFICATION

CROSS-REFERENCE TO RELATED APPLICATIONS

The present application claims priority under 35 U.S.C 119(a) to Korean Application No. 10-2018-0041456, filed on Apr. 10, 2018, which is incorporated herein by reference in its entirety.

BACKGROUND

1. Technical Field

Embodiments of the present disclosure generally relate to semiconductor devices and semiconductor systems, and more particularly, to semiconductor systems related to testing a plurality of memory chips.

2. Related Art

Recently, three-dimensional semiconductor devices have been fabricated to increase the integration density thereof. Each of the three-dimensional semiconductor devices may include a plurality of semiconductor chips which are stacked, and the plurality of semiconductor chips may be electrically connected to each other by through silicon vias (TSVs) that vertically penetrate the plurality of semiconductor chips. The semiconductor chips included in each three-dimensional semiconductor device may receive address signals, command signals, and other signals for entering a test mode and executing a test operation through the TSVs and may output signals and/or data that include some pieces of information through the TSVs. The plurality of semiconductor chips included in each three-dimensional semiconductor device may transmit signals to each other through the TSVs. In such a case, lengths of signal paths between the semiconductor device and a controller for controlling the semiconductor device may be reduced to prevent a signal transmission speed from being degraded.

Meanwhile, after the three-dimensional semiconductor devices are fabricated, the three-dimensional semiconductor devices have to be tested to confirm whether the three-dimensional semiconductor devices normally operate. In case of a semiconductor device having a plurality of stacked semiconductor chips, it may be important to reduce a test time of the plurality of stacked semiconductor chips without degrading the reliability of a test. This is because the test time affects the fabrication cost of the semiconductor device. Thus, a lot of effort have been focused on developing a method of reducing the test time of the three-dimensional semiconductor devices including TSVs without degrading the reliability of the test.

SUMMARY

According to an embodiment, a semiconductor system may be provided. The semiconductor system may include a first semiconductor device and a second semiconductor device. The first semiconductor device controls a test mode. The first semiconductor device outputs a chip identification and receives external data. The second semiconductor device includes a plurality of memory chips. One or more of the plurality of memory chips may be activated based on the chip identification to store input data into each of the plurality of memory chips that have been activated while a write operation is performed in the test mode. At least two of the plurality of memory chips are activated based on the chip identification to output the stored input data as the external data while a read operation is performed in the test mode.

According to an embodiment, a semiconductor device may include a first group of memory chips and a second group of memory chips. The first group of memory chips are stacked. One or more of the first group of memory chips may be activated during a write operation in a test mode to store input data into each of the memory chips that have been activated in the first group. The input data stored in one of the memory chips of the first group, which is activated by a chip identification, may be outputted as first external data through a first main pad during a read operation. The second group of memory chips are stacked. One or more of the second group of memory chips may be activated during the write operation in the test mode to store the input data into each of the memory chips that have been activated in the second group. The input data stored in one of the memory chips of the second group, which is activated by the chip identification, may be outputted as second external data through a second main pad during the read operation.

BRIEF DESCRIPTION OF THE DRAWINGS

FIGS. 9 to 14 are tables and schematic views illustrating an operation performed in a test mode of a semiconductor system according to an embodiment of the present embodiment.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Figure 1:
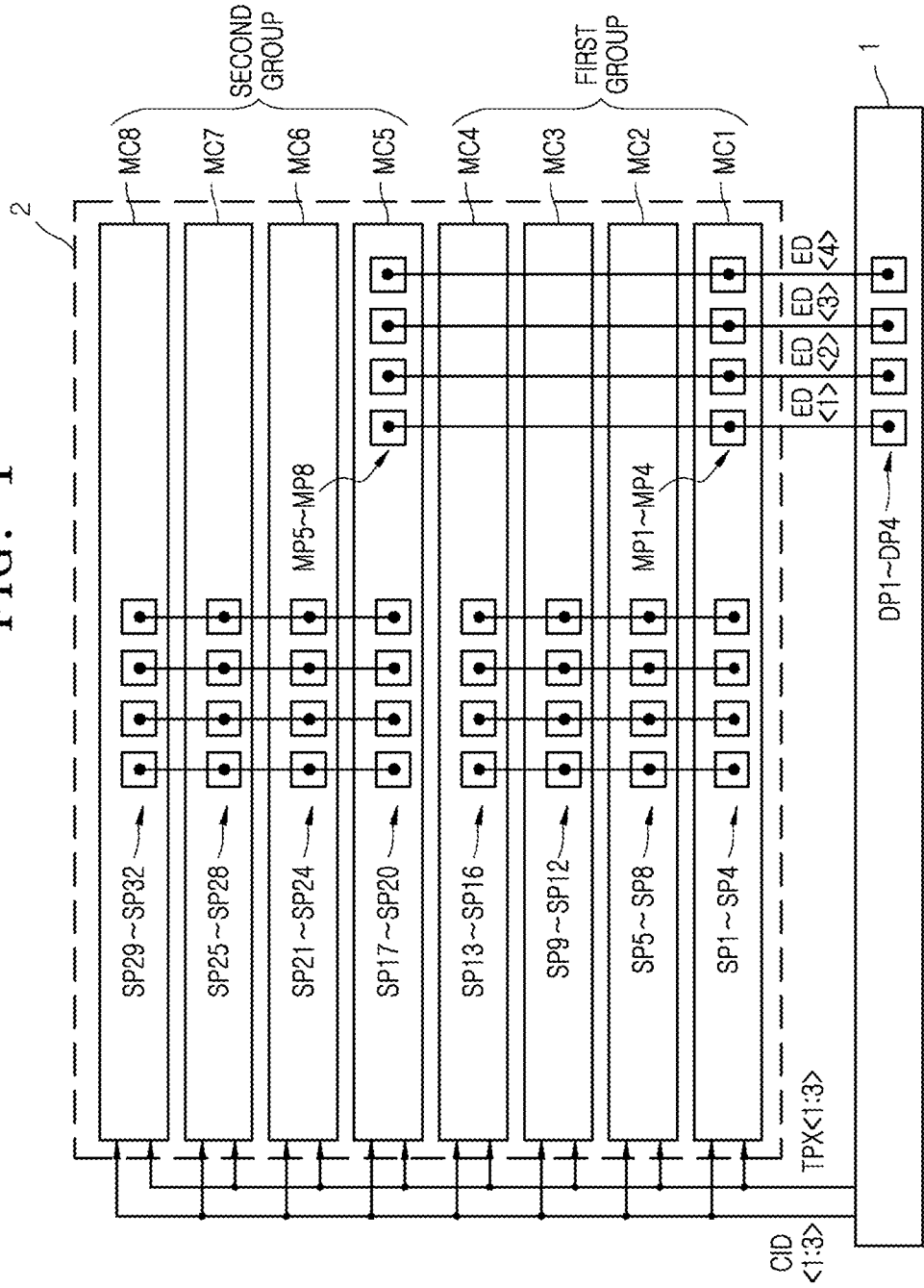
FIG. 1 is a block diagram illustrating a configuration of a semiconductor system according to an embodiment of the present disclosure.

As illustrated in FIG. 1, a semiconductor system according to an embodiment may include a first semiconductor device 1 and a second semiconductor device 2.

The first semiconductor device 1 may output first to third chip identifications CID<1:3> and first to third test control signals TPX<1:3>. The first semiconductor device 1 may receive first to fourth external data ED<1:4>. The first semiconductor device 1 may sense logic levels of the first to fourth external data ED<1:4> to test whether first to eighth memory chips MC1~MC8 included in the second semiconductor device 2 normally operate. The first semiconductor device 1 may include first to fourth data pads DP1, DP2, DP3 and DP4. The first semiconductor device 1 may receive the first to fourth external data ED<1:4> through the first to fourth data pads DP1, DP2, DP3 and DP4. The first to fourth data pads DP1, DP2, DP3 and DP4 may be connected to first to eighth main pads MP1~MP8 included in the second semiconductor device 2. The first to fourth data pads DP1, DP2, DP3 and DP4 may be electrically connected to the first to eighth main pads MP1~MP8 included in the second semiconductor device 2 by through silicon vias (TSVs). Alternatively, the first to fourth data pads DP1, DP2, DP3 and DP4 may be electrically connected to the first to eighth main pads MP1~MP8 included in the second semiconductor device 2 by metal wires. The first to third chip identifications CID<1:3> may have various logic level combinations for activating the first to eighth memory chips MC1~MC8 included in the second semiconductor device 2. For example, the first memory chip MC1 may be activated if the first to third chip identifications CID<1:3> has a logic level combination of 'L,L,L', and the eighth memory chip MC8 may be activated if the first to third chip identifications CID<1:3> has a logic level combination of 'H,H,H'. The first to third test control signals TPX<1:3> may be set as signals for controlling first to third test modes. The first test control signal TPX<1> may be set as a signal for activating the first test mode. The second test control signal TPX<2> may be set as a signal for activating the second test mode. The third test control signal TPX<3> may be set as a signal for activating the third test mode. The first test mode may be set as a test mode in which two memory chips immediately adjacent to each other among the first to fourth memory chips MC1~MC4 or among the fifth to eighth memory chips MC5~MC8 are activated to perform a read operation. The second test mode may be set as a test mode in which two memory chips separated from each other by at least one memory chip among the first to fourth memory chips MC1~MC4 or among the fifth to eighth memory chips MC5~MC8 are activated to perform the read operation. The third test mode may be set as a test mode in which any one of the first to fourth memory chips MC1~MC4 and any one of the fifth to eighth memory chips MC5~MC8 are activated to perform the read operation. The first to third test modes will be described more fully by the following explanations (see FIGS. 10, 12 and 14).

The second semiconductor device 2 may include the first to eighth memory chips MC1~MC8 as described above. The first to eighth memory chips MC1~MC8 may be sequentially stacked on the first semiconductor device 1 or a substrate (not shown). The first to fourth memory chips MC1~MC4 may constitute a first group of memory chips, and the fifth to eighth memory chips MC5~MC8 may constitute a second group of memory chips. In some embodiments the first to eighth memory chips MC1~MC8 may be vertically stacked. In other embodiments, the first to eighth memory chips MC1~MC8 may be stacked.

The first memory chip MC1 may include first to fourth sub-pads SP1~SP4 and the first to fourth main pads MP1~MP4. The first memory chip MC1 may store input data (DIN of FIG. 2) during a write operation. The first memory chip MC1 may be activated if the first to third chip identifications CID<1:3> have a first logic level combination of 'L,L,L'. The first memory chip MC1 may output the input data DIN stored therein to the first to fourth sub-pads SP1~SP4 in response to the first to third chip identifications CID<1:3> during the read operation. The first memory chip MC1 may output the data loaded on the first to fourth sub-pads SP1~SP4 as the first to fourth external data ED<1:4> through the first to fourth main pads MP1~MP4.

The second memory chip MC2 may include fifth to eighth sub-pads SP5~SP8. The second memory chip MC2 may store the input data DIN during the write operation. The second memory chip MC2 may be activated if the first to third chip identifications CID<1:3> have a second logic level combination of 'L,L,H'. The second memory chip MC2 may output the input data DIN stored therein to the fifth to eighth sub-pads SP5~SP8 in response to the first to third chip identifications CID<1:3> during the read operation. The fifth to eighth sub-pads SP5~SP8 may be connected to the first to fourth sub-pads SP1~SP4. The fifth to eighth sub-pads SP5~SP8 may be electrically connected to the first to fourth sub-pads SP1~SP4 by TSVs. Alternatively, the fifth to eighth sub-pads SP5~SP8 may be electrically connected to the first to fourth sub-pads SP1~SP4 by metal wires.

The third memory chip MC3 may include ninth to twelfth sub-pads SP9~SP12. The third memory chip MC3 may store the input data DIN during the write operation. The third memory chip MC3 may be activated if the first to third chip identifications CID<1:3> have a third logic level combination of 'L,H,L'. The third memory chip MC3 may output the input data DIN stored therein to the ninth to twelfth sub-pads SP9~SP12 in response to the first to third chip identifications CID<1:3> during the read operation. The ninth to twelfth sub-pads SP9~SP12 may be connected to the first to fourth sub-pads SP1~SP4. The ninth to twelfth sub-pads SP9~SP12 may be electrically connected to the first to fourth sub-pads SP1~SP4 by TSVs. Alternatively, the ninth to twelfth sub-pads SP9~SP12 may be electrically connected to the first to fourth sub-pads SP1~SP4 by metal wires.

The fourth memory chip MC4 may include thirteenth to sixteenth sub-pads SP13~SP16. The fourth memory chip MC4 may store the input data DIN during the write operation. The fourth memory chip MC4 may be activated if the first to third chip identifications CID<1:3> have a fourth logic level combination of 'L,H,H'. The fourth memory chip MC4 may output the input data DIN stored therein to the thirteenth to sixteenth sub-pads SP13~SP16 in response to the first to third chip identifications CID<1:3> during the read operation. The thirteenth to sixteenth sub-pads SP13~SP16 may be connected to the first to fourth sub-pads SP1~SP4. The thirteenth to sixteenth sub-pads SP13~SP16 may be electrically connected to the first to fourth sub-pads SP1~SP4 by TSVs. Alternatively, the thirteenth to sixteenth sub-pads SP13~SP16 may be electrically connected to the first to fourth sub-pads SP1~SP4 by metal wires.

The fifth memory chip MC5 may include seventeenth to twentieth sub-pads SP17~SP20 and the fifth to eighth main pads MP5~MP8. The fifth memory chip MC5 may store the input data DIN during the write operation. The fifth memory chip MC5 may be activated if the first to third chip identifications CID<1:3> have a fifth logic level combination of 'H,L,L'. The fifth memory chip MC5 may output the input data DIN stored therein to the seventeenth to twentieth sub-pads SP17~SP20 in response to the first to third chip identifications CID<1:3> during the read operation. The fifth memory chip MC5 may output the data loaded on the seventeenth to twentieth sub-pads SP17~SP20 as the first to fourth external data ED<1:4> through the fifth to eighth main pads MP5~MP8.

The sixth memory chip MC6 may include twenty-first to twenty-fourth sub-pads SP21~SP24. The sixth memory chip MC6 may store the input data DIN during the write operation. The sixth memory chip MC6 may be activated if the first to third chip identifications CID<1:3> have a sixth logic level combination of 'H,L,H'. The sixth memory chip MC6 may output the input data DIN stored therein to the twenty-first to twenty-fourth sub-pads SP21~SP24 in response to the first to third chip identifications CID<1:3> during the read operation. The twenty-first to twenty-fourth sub-pads SP21~SP24 may be connected to the seventeenth to twentieth sub-pads SP17~SP20. The twenty-first to twenty-fourth sub-pads SP21~SP24 may be electrically connected to the seventeenth to twentieth sub-pads SP17~SP20 by TSVs. Alternatively, the twenty-first to twenty-fourth sub-pads SP21~SP24 may be electrically connected to the seventeenth to twentieth sub-pads SP17~SP20 by metal wires.

The seventh memory chip MC7 may include twenty-fifth to twenty-eighth sub-pads SP25~SP28. The seventh memory chip MC7 may store the input data DIN during the write operation. The seventh memory chip MC7 may be activated if the first to third chip identifications CID<1:3> have a seventh logic level combination of 'H,H,L'. The seventh memory chip MC7 may output the input data DIN stored therein to the twenty-fifth to twenty-eighth sub-pads SP25~SP28 in response to the first to third chip identifications CID<1:3> during the read operation. The twenty-fifth to twenty-eighth sub-pads SP25~SP28 may be connected to the seventeenth to twentieth sub-pads SP17~SP20. The twenty-fifth to twenty-eighth sub-pads SP25~SP28 may be electrically connected to the seventeenth to twentieth sub-pads SP17~SP20 by TSVs. Alternatively, the twenty-fifth to twenty-eighth sub-pads SP25~SP28 may be electrically connected to the seventeenth to twentieth sub-pads SP17~SP20 by metal wires.

The eighth memory chip MC8 may include twenty-ninth to thirty-second sub-pads SP29~SP32. The eighth memory chip MC8 may store the input data DIN during the write operation. The eighth memory chip MC8 may be activated if the first to third chip identifications CID<1:3> have an eighth logic level combination of 'H,H,H'. The eighth memory chip MC8 may output the input data DIN stored therein to the twenty-ninth to thirty-second sub-pads SP29~SP32 in response to the first to third chip identifications CID<1:3> during the read operation. The twenty-ninth to thirty-second sub-pads SP29~SP32 may be connected to the seventeenth to twentieth sub-pads SP17~SP20. The twenty-ninth to thirty-second sub-pads SP29~SP32 may be electrically connected to the seventeenth to twentieth sub-pads SP17~SP20 by TSVs. Alternatively, the twenty-ninth to thirty-second sub-pads SP29~SP32 may be electrically connected to the seventeenth to twentieth sub-pads SP17~SP20 by metal wires.

Figure 2:
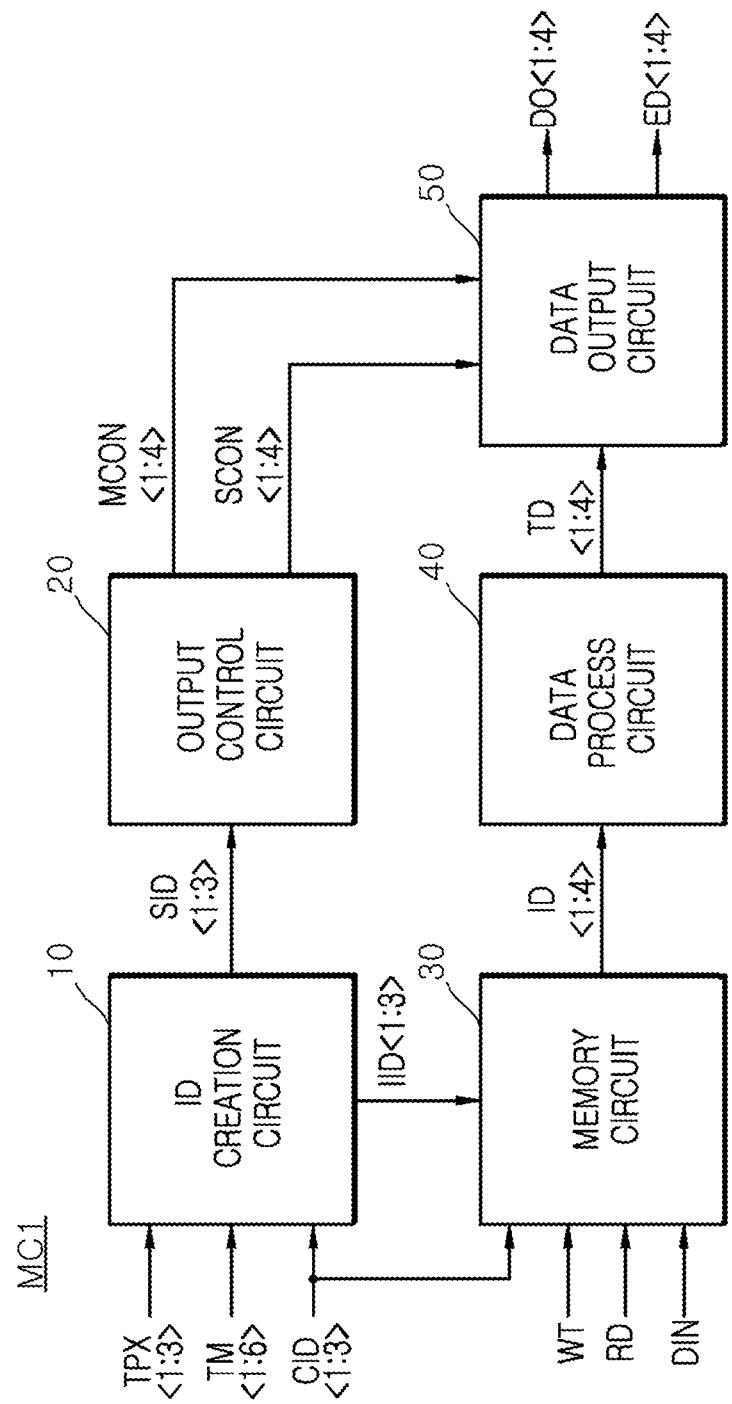
FIG. 2 is a block diagram illustrating a configuration of a first memory chip included in the semiconductor system of FIG. 1.

Referring to FIG. 2, the first memory chip MC1 may include an identification (ID) creation circuit 10, an output control circuit 20, a memory circuit 30, a data process circuit 40, and a data output circuit 50.

The ID creation circuit 10 may change the first to third chip identifications CID<1:3> to generate first to third internal identifications IID<1:3>, in response to first to sixth test mode signals TM<1:6>. The ID creation circuit 10 may change the first to third chip identifications CID<1:3> to generate first to third set identifications SID<1:3>, in response to the first to third test control signals TPX<1:3> and the first to sixth test mode signals TM<1:6>. The first to sixth test mode signals TM<1:6> may be provided by the first semiconductor device 1 or an external device. Alternatively, the first to sixth test mode signals TM<1:6> may be generated by a circuit included in the second semiconductor device 2 to have any one of various logic level combinations according to the test mode. The first to sixth test mode signals TM<1:6> may be signals for changing logic levels of the first to third chip identifications CID<1:3>. The first and second test mode signals TM<1:2> may be signals for changing a logic level of the first chip identification CID<1>. The third and fourth test mode signals TM<3:4> may be signals for changing a logic level of the second chip identification CID<2>. The fifth and sixth test mode signals TM<5:6> may be signals for changing a logic level of the third chip identification CID<3>.

The output control circuit 20 may generate first to fourth sub-control signals SCON<1:4> and first to fourth main control signals MCON<1:4> in response to the first to third set identifications SID<1:3>. The output control circuit 20 may generate the first to fourth sub-control signals SCON<1:4> and the first to fourth main control signals MCON<1:4> according to a combination (i.e., a logic level combination) of the first to third set identifications SID<1:3> during the read operation.

The memory circuit 30 may be activated if the first to third chip identifications CID<1:3> or the first to third internal identifications IID<1:3> have a first logic level combination. The first logic level combination of the first to third chip identifications CID<1:3> means that the first chip identification CID<1> has a logic "low" level, the second chip identification CID<2> has a logic "low" level, and the third chip identification CID<3> has a logic "low" level. The first logic level combination of the first to third internal identifications IID<1:3> means that the first internal identification IID<1> has a logic "low" level, the second internal identification IID<2> has a logic "low" level, and the third internal identification IID<3> has a logic "low" level. The memory circuit 30 may store the input data DIN during the write operation. The memory circuit 30 may store the input data DIN in response to a write signal WT. The memory circuit 30 may output the stored input data DIN as first to fourth internal data ID<1:4> during the read operation. The memory circuit 30 may output the stored input data DIN as first to fourth internal data ID<1:4> in response to a read signal RD. The number of bits included in the first to fourth internal data ID<1:4> may be determined by a burst length of the second semiconductor device 2. According to an embodiment, each of the first to fourth internal data ID<1:4> may be realized to include four-bit data. Thus, the burst length may be set to be '16'. The bit signals of the first to fourth internal data ID<1:4> may be set as signals including information on whether all of banks included in the memory circuit 30 normally operate. The first to fourth internal data ID<1:4> may be generated by performing a general compressive parallel test that outputs a comparison result of a plurality of bits.

The data process circuit 40 may output the first to fourth internal data ID<1:4> as first to fourth transmission data TD<1:4>. For example, if the burst length is set to be '16', the data process circuit 40 may output the 16-bit data included in the first to fourth internal data ID<1:4> as the first and second transmission data TD<1:2> or the third and fourth transmission data TD<3:4>.

The data output circuit 50 may generate first to fourth output data DO<1:4> from the first to fourth transmission data TD<1:4> in response to the first to fourth sub-control signals SCON<1:4>. The first to fourth output data DO<1:4> may be outputted through the first to fourth sub-pads SP1~SP4. The data output circuit 50 may generate the first to fourth external data ED<1:4> from the first to fourth output data DO<1:4> in response to the first to fourth main control signals MCON<1:4>. The first to fourth external data ED<1:4> may be outputted through the first to fourth main pads MP1~MP4.

Figure 3:
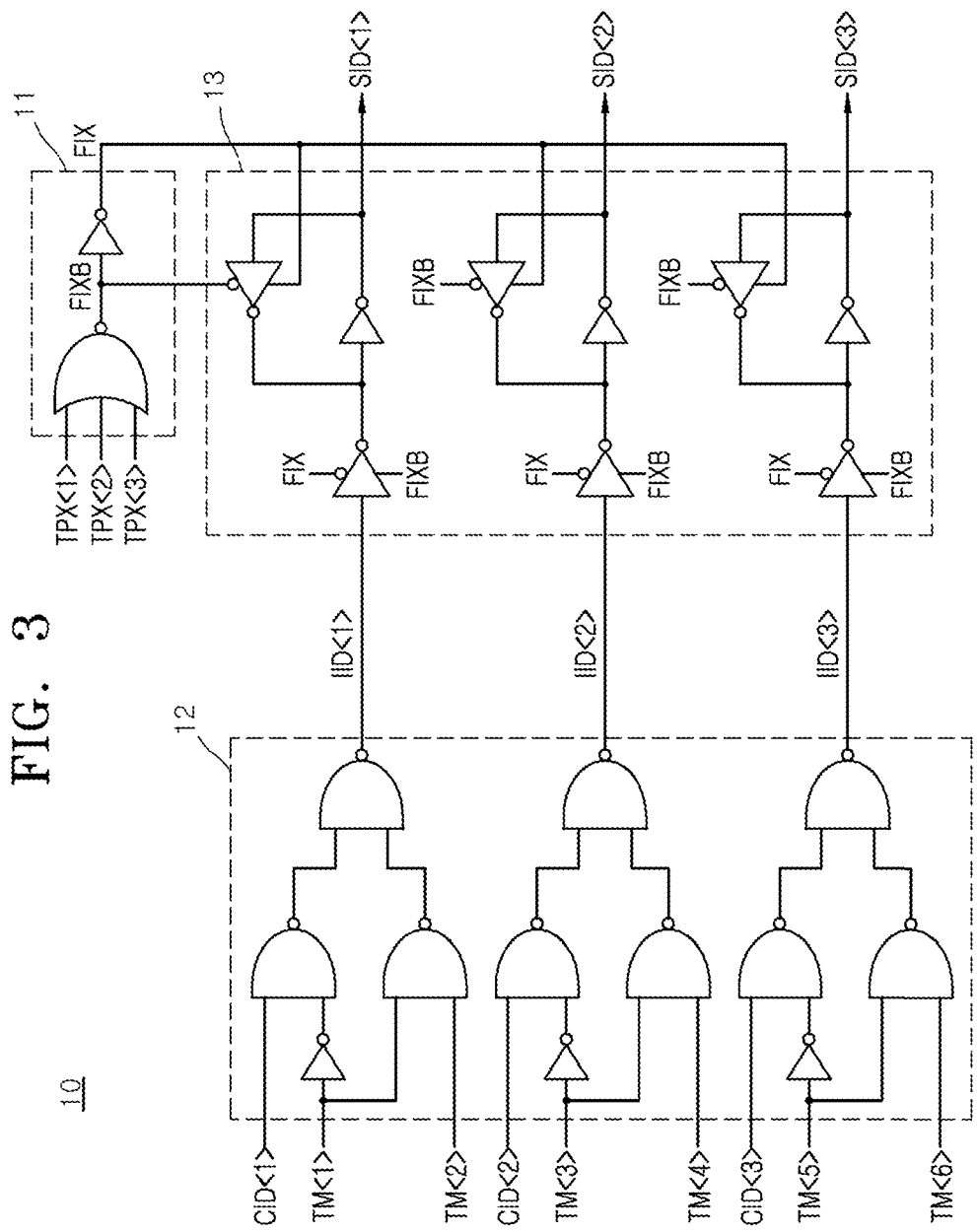
FIG. 3 is a circuit diagram illustrating a configuration of an ID creation circuit included in the first memory chip of FIG. 2.

Each of the second to eighth memory chips MC2~MC8 may be realized using substantially the same configuration as the first memory chip MC1 to perform the same operation as the first memory chip MC1. Thus, descriptions of the second to eighth memory chips MC2~MC8 will be omitted hereinafter, Referring to FIG. 3, the ID creation circuit 10 may include a fixation signal generation circuit 11, an internal ID generation circuit 12 and a latch circuit 13.

The fixation signal generation circuit 11 may perform a logical OR operation on the first to third test control signals TPX<1:3> to generate a fixation signal FIX. The fixation signal generation circuit 11 may generate the fixation signal FIX which is enabled to have a logic "high" level if at least one of the first to third test control signals TPX<1:3> has a logic "high" level. The fixation signal generation circuit 11 may perform a logical NOR operation on the first to third test control signals TPX<1:3> to generate an inverted fixation signal FIXB. The inverted fixation signal FIXB is a signal having a logic level which is opposite to a logic level of the fixation signal FIX. The first test control signal TPX<1> may be enabled to have a logic "high" level to activate the first test mode. The second test control signal TPX<2> may be enabled to have a logic "high" level to activate the second test mode. The third test control signal TPX<3> may be enabled to have a logic "high" level to activate the third test mode.

The internal ID generation circuit 12 may change logic levels of the first to third chip identifications CID<1:3> to generate the first to third internal identifications IID<1:3>, according to logic levels of the first to sixth test mode signals TM<1:6>. The internal ID generation circuit 12 may buffer the first to third chip identifications CID<1:3> to generate the first to third internal identifications IID<1:3>, according to logic levels of the first to sixth test mode signals TM<1:6>.

Operations of generating the first to third internal identifications IID<1:3> from the first to third chip identifications CID<1:3> according to logic levels of the first to sixth test mode signals TM<1:6> will be described hereinafter.

First, an operation of generating the first internal identification IID<1> from the first chip identification CID<1> will be described hereinafter.

If the first test mode signal TM<1> has a logic "high" level, the internal ID generation circuit 12 may generate the first internal identification IID<1> having the same logic level as the second test mode signal TM<2> regardless of a logic level of the first chip identification CID<1>. The internal ID generation circuit 12 may generate the first internal identification IID<1> having a logic "high" level if the first test mode signal TM<1> has a logic "high" level and the second test mode signal TM<1> has a logic "high" level. The internal ID generation circuit 12 may generate the first internal identification IID<1> having a logic "low" level if the first test mode signal TM<1> has a logic "high" level and the second test mode signal TM<1> has a logic "low" level. If the first test mode signal TM<1> has a logic "low" level, the internal ID generation circuit 12 may generate the first internal identification IID<1> having the same logic level as the first chip identification CID<1>.

Next, an operation of generating the second internal identification IID<2> from the second chip identification CID<2> will be described hereinafter.

If the third test mode signal TM<3> has a logic "high" level, the internal ID generation circuit 12 may generate the second internal identification IID<2> having the same logic level as the fourth test mode signal TM<4> regardless of a logic level of the second chip identification CID<2>. The internal ID generation circuit 12 may generate the second internal identification IID<2> having a logic "high" level if the third test mode signal TM<3> has a logic "high" level and the fourth test mode signal TM<4> has a logic "high" level. The internal ID generation circuit 12 may generate the second internal identification IID<2> having a logic "low" level if the third test mode signal TM<3> has a logic "high" level and the fourth test mode signal TM<4> has a logic "low" level. If the third test mode signal TM<3> has a logic "low" level, the internal ID generation circuit 12 may generate the second internal identification IID<2> having the same logic level as the second chip identification CID<2>.

Next, an operation of generating the third internal identification IID<3> from the third chip identification CID<3> will be described hereinafter.

If the fifth test mode signal TM<5> has a logic "high" level, the internal ID generation circuit 12 may generate the third internal identification IID<3> having the same logic level as the sixth test mode signal TM<6> regardless of a logic level of the third chip identification CID<3>. The internal ID generation circuit 12 may generate the third internal identification IID<3> having a logic "high" level if the fifth test mode signal TM<5> has a logic "high" level and the sixth test mode signal TM<6> has a logic "high" level. The internal ID generation circuit 12 may generate the third internal identification IID<3> having a logic "low" level if the fifth test mode signal TM<5> has a logic "high" level and the sixth test mode signal TM<6> has a logic "low" level. If the fifth test mode signal TM<5> has a logic "low" level, the internal ID generation circuit 12 may generate the third internal identification IID<3> having the same logic level as the third chip identification CID<3>.

The latch circuit 13 may receive the first to third internal identifications IID<1:3> to generate the first to third set identifications SID<1:3>, in response to the fixation signal FIX and the inverted fixation signal FIXB. The latch circuit 13 may receive the first to third internal identifications IID<1:3> to generate the first to third set identifications SID<1:3> if the first to third test modes are inactivated. The latch circuit 13 may interrupt that the first to third internal identifications IID<1:3> are inputted to the latch circuit 13, if any one of the first to third test modes is activated. The latch circuit 13 may interrupt that the first to third internal identifications IID<1:3> are inputted to the latch circuit 13, if the fixation signal FIX has a logic "high" level and the inverted fixation signal FIXB has a logic "low" level. The latch circuit 13 may store first to third set identifications SID<1:3> if any one of the first to third test modes is activated.

Figure 4:
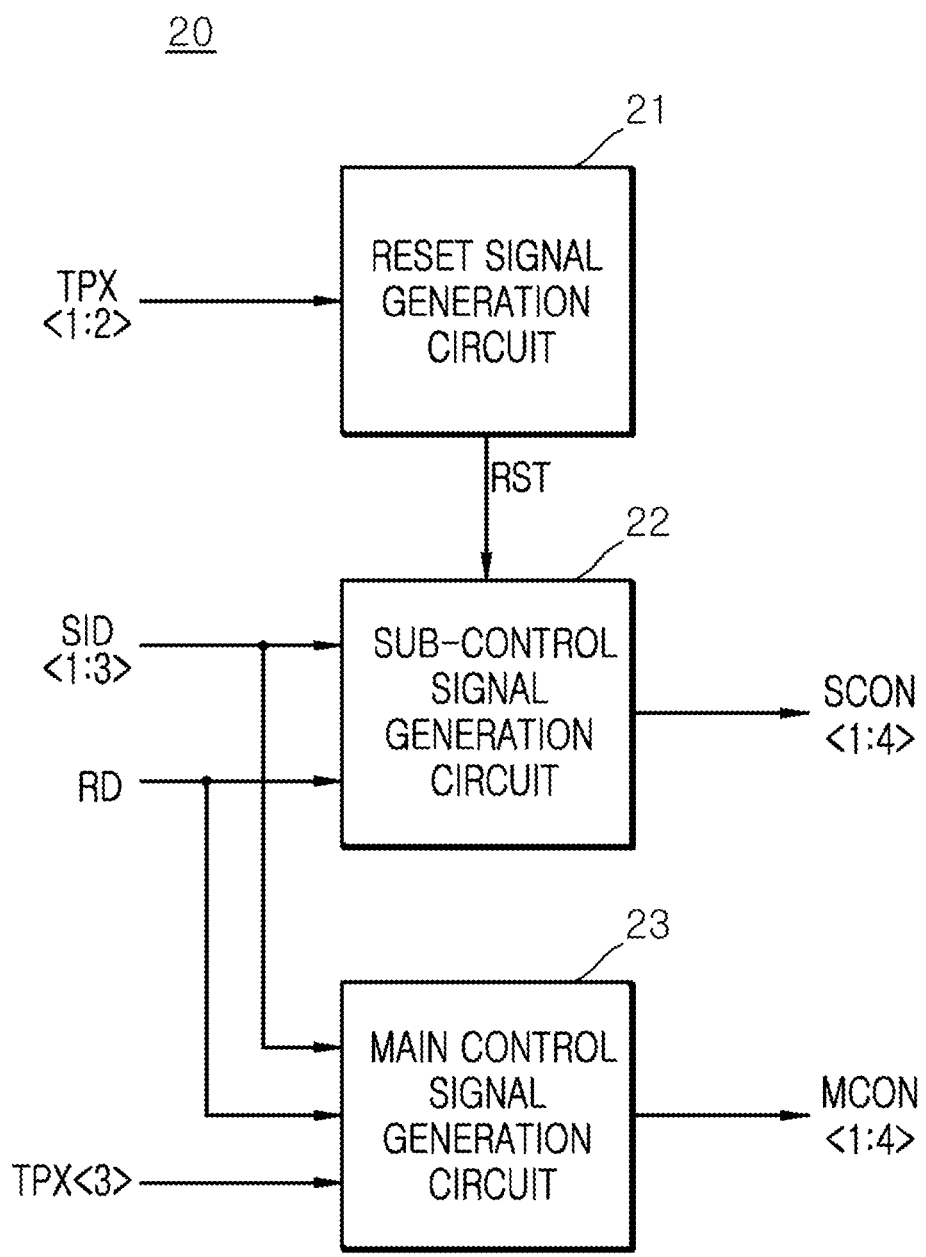
FIG. 4 is a block diagram illustrating a configuration of an output control circuit included in the first memory chip of FIG. 2.

Referring to FIG. 4, the output control circuit 20 may include a reset signal generation circuit 21, a sub-control signal generation circuit 22 and a main control signal generation circuit 23.

The reset signal generation circuit 21 may generate a reset signal RST which is enabled, in response to the first and second test control signals TPX<1:2>. The reset signal generation circuit 21 may perform a logical NOR operation of the first and second test control signals TPX<1:2> to generate the reset signal RST. The reset signal generation circuit 21 may generate the reset signal RST enabled to have a logic "high" level if both of the first and second test control signals TPX<1:2> have a logic "low" level.

The sub-control signal generation circuit 22 may generate the first to fourth sub-control signals SCON<1:4> which are enabled, in response to the reset signal RST. The sub-control signal generation circuit 22 may generate the first to fourth sub-control signals SCON<1:4> from the first and second set identifications SID<1:2> during the read operation. The sub-control signal generation circuit 22 may decode the first and second set identifications SID<1:2> to generate the first to fourth sub-control signals SCON<1:4> during the read operation. The sub-control signal generation circuit 22 may generate the first to fourth sub-control signals SCON<1:4> from the first and second set identifications SID<1:2> in response to the read signal RD.

The main control signal generation circuit 23 may generate the first to fourth main control signals MCON<1:4> from the first to third set identifications SID<1:3> in response to the third test control signal TPX<3> during the read operation. The main control signal generation circuit 23 may generate the first to fourth main control signals MCON<1:4> which are disabled if the first to third set identifications SID<1:3> do not have a predetermined logic level combination during the read operation.

Figure 5:
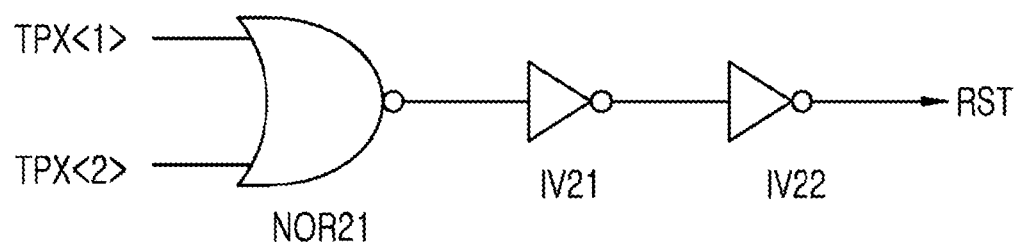
FIG. 5 is a circuit diagram illustrating a configuration of a reset signal generation circuit included in the output control circuit of FIG. 4.

Referring to FIG. 5, the reset signal generation circuit 21 may be realized using a NOR gates NOR21 and inverters IV21 and IV22.

The reset signal generation circuit 21 may perform a logical NOR operation on the first and second test control signals TPX<1:2> to generate the reset signal RST. The reset signal generation circuit 21 may generate the reset signal RST which is enabled to have a logic "high" level if the first test control signal TPX<1> has a logic "low" level and the second test control signal TPX<2> has a logic "low" level.

Figure 6:
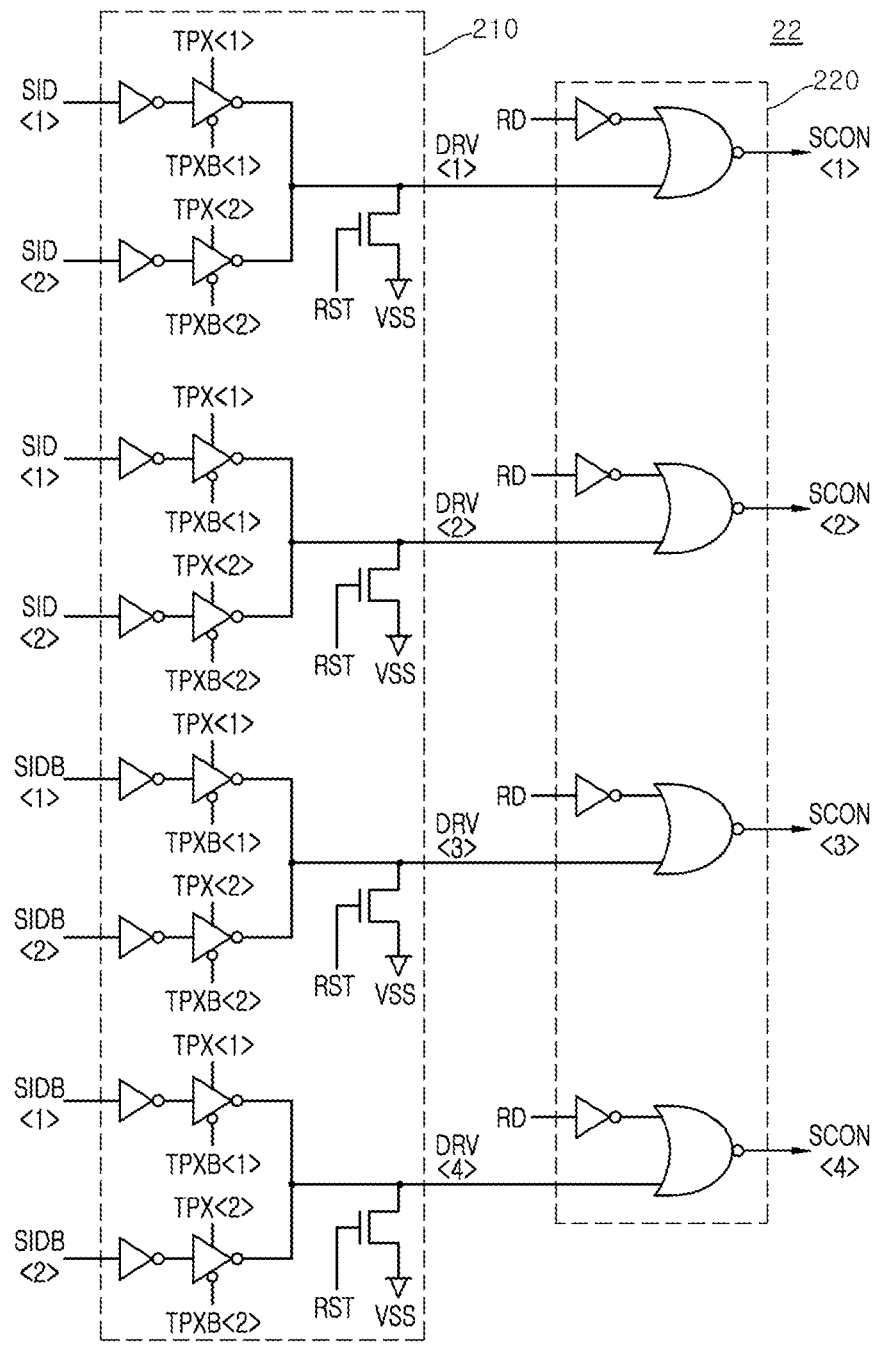
FIG. 6 is a circuit diagram illustrating a configuration of a sub-control signal generation circuit included in the output control circuit of FIG. 4.

Referring to FIG. 6, the sub-control signal generation circuit 22 may include a drive signal generation circuit 210 and a logic circuit 220.

The drive signal generation circuit 210 may generate first to fourth drive signals DRV<1:4>, which are disabled to have a logic "low" level, in response to the reset signal RST. The drive signal generation circuit 210 may generate the first to fourth drive signals DRV<1:4>, which are disabled to have a logic "low" level, if the reset signal RST is enabled to have a logic "high" level.

The drive signal generation circuit 210 may generate the first and second drive signals DRV<1:2> having the same logic level as the first set identification SID<1> if the first test control signal TPX<1> has a logic "high" level. The drive signal generation circuit 210 may generate the third and fourth drive signals DRV<3:4> having the same logic level as a first inverted set identification SIDB<1> if the first test control signal TPX<1> has a logic "high" level. The first inverted set identification SIDB<1> may have a logic level which is opposite to a logic level of the first set identification SID<1>.

The drive signal generation circuit 210 may generate the first and second drive signals DRV<1:2> having the same logic level as the second set identification SID<2> if the second test control signal TPX<2> has a logic "high" level. The drive signal generation circuit 210 may generate the third and fourth drive signals DRV<3:4> having the same logic level as a second inverted set identification SIDB<2> if the second test control signal TPX<2> has a logic "high" level. The second inverted set identification SIDB<2> may have a logic level which is opposite to a logic level of the second set identification SID<2>.

Figure 8:
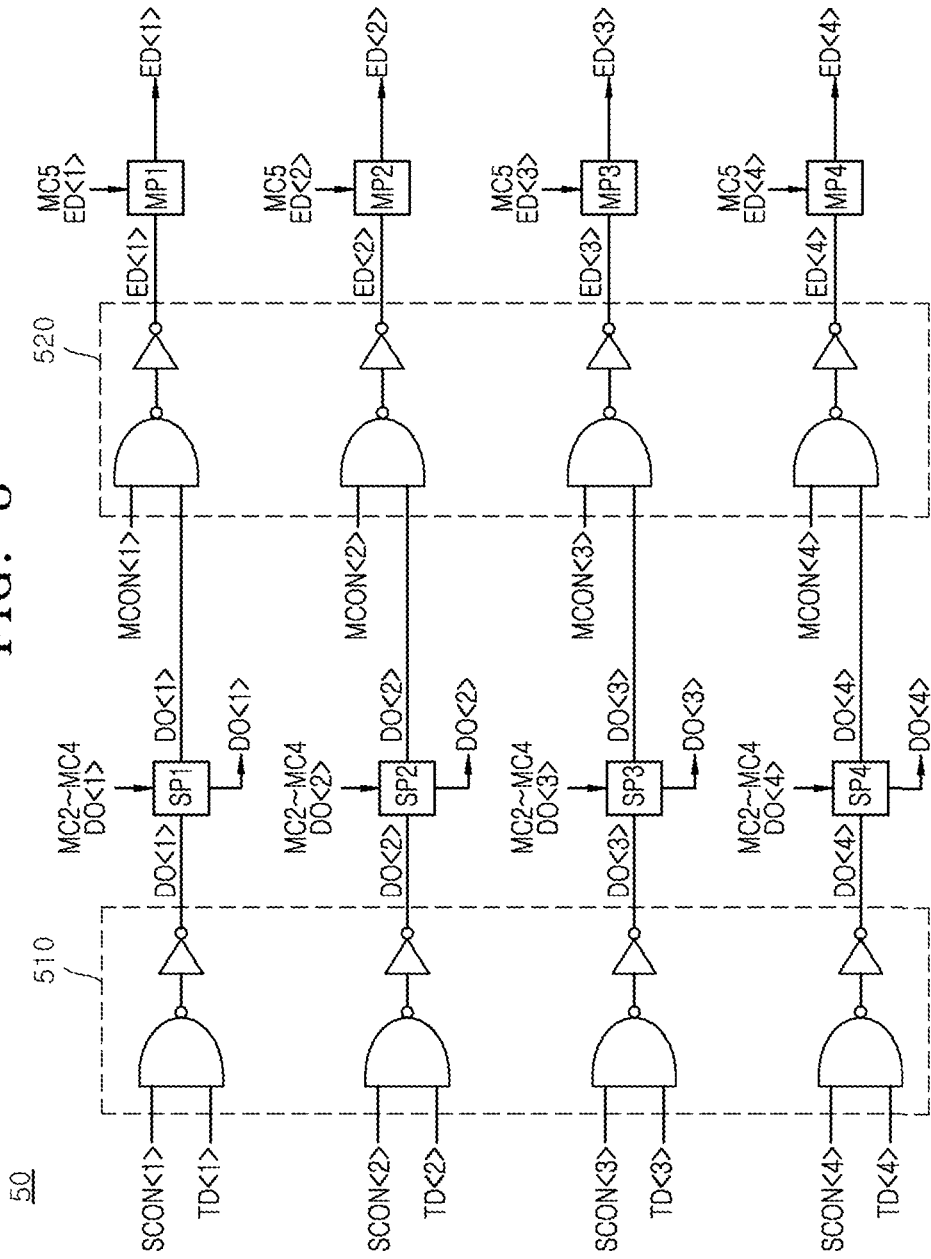
FIG. 8 is a circuit diagram illustrating a configuration of a data output circuit included in the first memory chip of FIG. 2.

The logic circuit 220 may inversely buffer the first to fourth drive signals DRV<1:4> to generate the first to fourth sub-control control signals SCON<1:4> during the read operation. The logic circuit 220 may inversely buffer the first to fourth drive signals DRV<1:4> to generate the first to fourth sub-control control signals SCON<1:4>, in response to the read signal RD. FIG. 8 also illustrates first inverted test control signal TPXB<1>, second inverted test control signal TPXB<2> and voltage source VSS (i.e., ground voltage).

Figure 7:
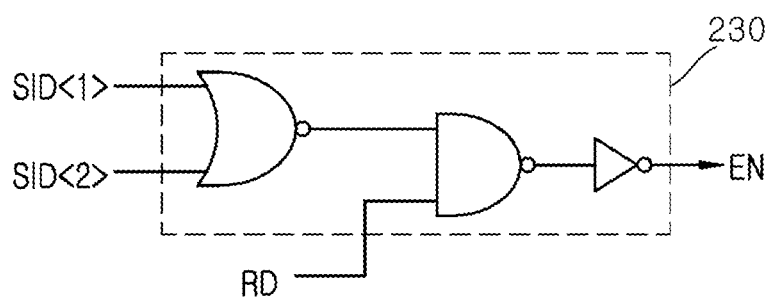
FIG. 7 is a circuit diagram illustrating a configuration of a main control signal generation circuit included in the output control circuit of FIG. 4.
Figure 7:
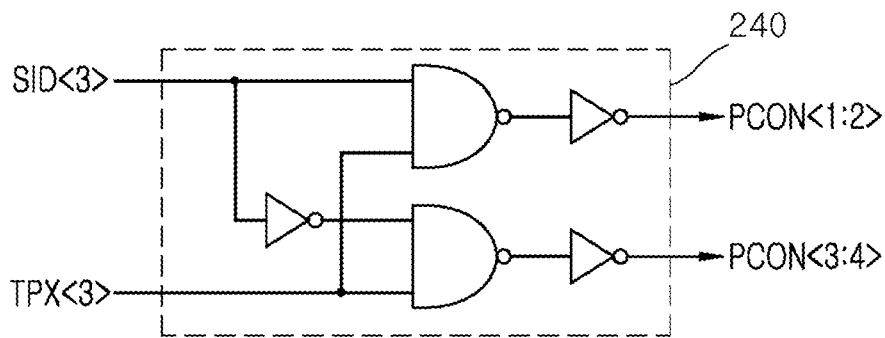
Figure 7:
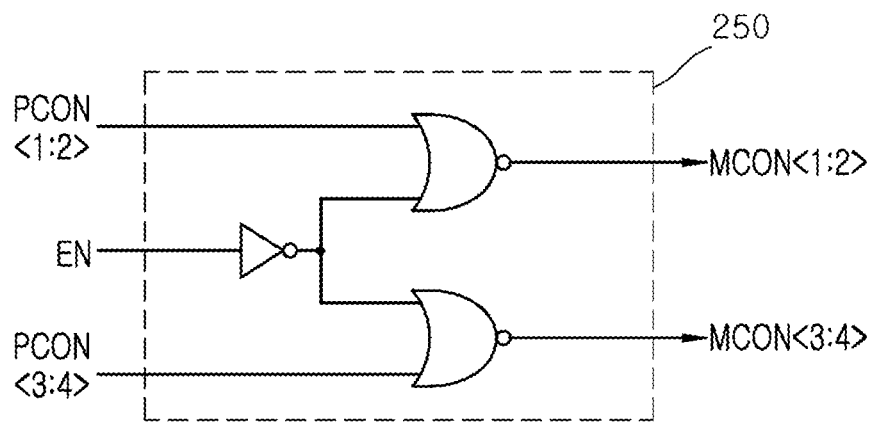

Referring to FIG. 7, the main control signal generation circuit 23 may include an enablement signal generation circuit 230, a pre-control signal generation circuit 240 and a main control signal output circuit 250.

The enablement signal generation circuit 230 may generate an enablement signal EN which is enabled if the first and second set identifications SID<1:2> have a predetermined logic level combination during the read operation. The enablement signal generation circuit 230 may generate the enablement signal EN which is enabled to have a logic "high" level in response to the read signal RD if the first set identification SID<1> has a logic "low" level and the second set identification SID<2> has a logic "low" level. That is, the predetermined logic level combination of the first and second set identifications SID<1:2> means that both of the first and second set identifications SID<1:2> have a logic "low" level.

The pre-control signal generation circuit 240 may generate first to fourth pre-control signals PCON<1:4> from the third set identification SID<3> in response to the third test control signal TPX<3>. The pre-control signal generation circuit 240 may buffer the third set identification SID<3> to generate the first and second pre-control signals PCON<1:2> if the third test control signal TPX<3> has a logic "high" level. The pre-control signal generation circuit 240 may inversely buffer the third set identification SID<3> to generate the third and fourth pre-control signals PCON<3:4> if the third test control signal TPX<3> has a logic "high" level. The pre-control signal generation circuit 240 may generate the first to fourth pre-control signals PCON<1:4> having a logic "low" level if the third test control signal TPX<3> has a logic "low" level.

The main control signal output circuit 250 may generate the first to fourth main control signals MCON<1:4> from the first to fourth pre-control signals PCON<1:4> in response to the enablement signal EN. The main control signal output circuit 250 may inversely buffer the first to fourth pre-control signals PCON<1:4> to generate the first to fourth main control signals MCON<1:4> if the enablement signal EN is enabled to have a logic "high" level. The main control signal output circuit 250 may generate the first to fourth main control signals MCON<1:4> which are disabled to have a logic "low" level if the enablement signal EN is disabled to have a logic "low" level.

Referring to FIG. 8, the data output circuit 50 may include a sub-output circuit 510 and a main output circuit 520.

The sub-output circuit 510 may buffer the first transmission data TD<1> to generate the first output data DO<1> if the first sub-control signal SCON<1> is enabled to have a logic "high" level. The sub-output circuit 510 may output the first output data DO<1> to the first sub-pad SP1. The first output data DO<1> outputted from the second to fourth memory chips MC2~MC4 may also be transmitted to the first sub-pad SP1.

The sub-output circuit 510 may buffer the second transmission data TD<2> to generate the second output data DO<2> if the second sub-control signal SCON<2> is enabled to have a logic "high" level. The sub-output circuit 510 may output the second output data DO<2> to the second sub-pad SP2. The second output data DO<2> outputted from the second to fourth memory chips MC2~MC4 may also be transmitted to the second sub-pad SP2.

The sub-output circuit 510 may buffer the third transmission data TD<3> to generate the third output data DO<3> if the third sub-control signal SCON<3> is enabled to have a logic "high" level. The sub-output circuit 510 may output the third output data DO<3> to the third sub-pad SP3. The third output data DO<3> outputted from the second to fourth memory chips MC2~MC4 may also be transmitted to the third sub-pad SP3.

The sub-output circuit 510 may buffer the fourth transmission data TD<4> to generate the fourth output data DO<4> if the fourth sub-control signal SCON<4> is enabled to have a logic "high" level.

The sub-output circuit 510 may output the fourth output data DO<4> to the fourth sub-pad SP4. The fourth output data DO<4> outputted from the second to fourth memory chips MC2~MC4 may also be transmitted to the fourth sub-pad SP4.

The main output circuit 520 may buffer the first output data DO<1> loaded on the first sub-pad SP1 to generate the first external data ED<1> if the first main control signal MCON<1> is enabled to have a logic "high" level. The main output circuit 520 may output the first external data ED<1> to the first main pad MP1. The first external data ED<1> outputted from the fifth memory chip MC5 may also be transmitted to the first main pad MP1. The first external data ED<1> may be outputted through the first main pad MP1.

The main output circuit 520 may buffer the second output data DO<2> loaded on the second sub-pad SP2 to generate the second external data ED<2> if the second main control signal MCON<2> is enabled to have a logic "high" level. The main output circuit 520 may output the second external data ED<2> to the second main pad MP2. The second external data ED<2> outputted from the fifth memory chip MC5 may also be transmitted to the second main pad MP2. The second external data ED<2> may be outputted through the second main pad MP2.

The main output circuit 520 may buffer the third output data DO<3> loaded on the third sub-pad SP3 to generate the third external data ED<3> if the third main control signal MCON<3> is enabled to have a logic "high" level. The main output circuit 520 may output the third external data ED<3> to the third main pad MP3. The third external data ED<3> outputted from the fifth memory chip MC5 may also be transmitted to the third main pad MP3. The third external data ED<3> may be outputted through the third main pad MP3.

The main output circuit 520 may buffer the fourth output data DO<4> loaded on the fourth sub-pad SP4 to generate the fourth external data ED<4> if the fourth main control signal MCON<4> is enabled to have a logic "high" level. The main output circuit 520 may output the fourth external data ED<4> to the fourth main pad MP4. The fourth external data ED<4> outputted from the fifth memory chip MC5 may also be transmitted to the fourth main pad MP4. The fourth external data ED<4> may be outputted through the fourth main pad MP4.

Figure 10:
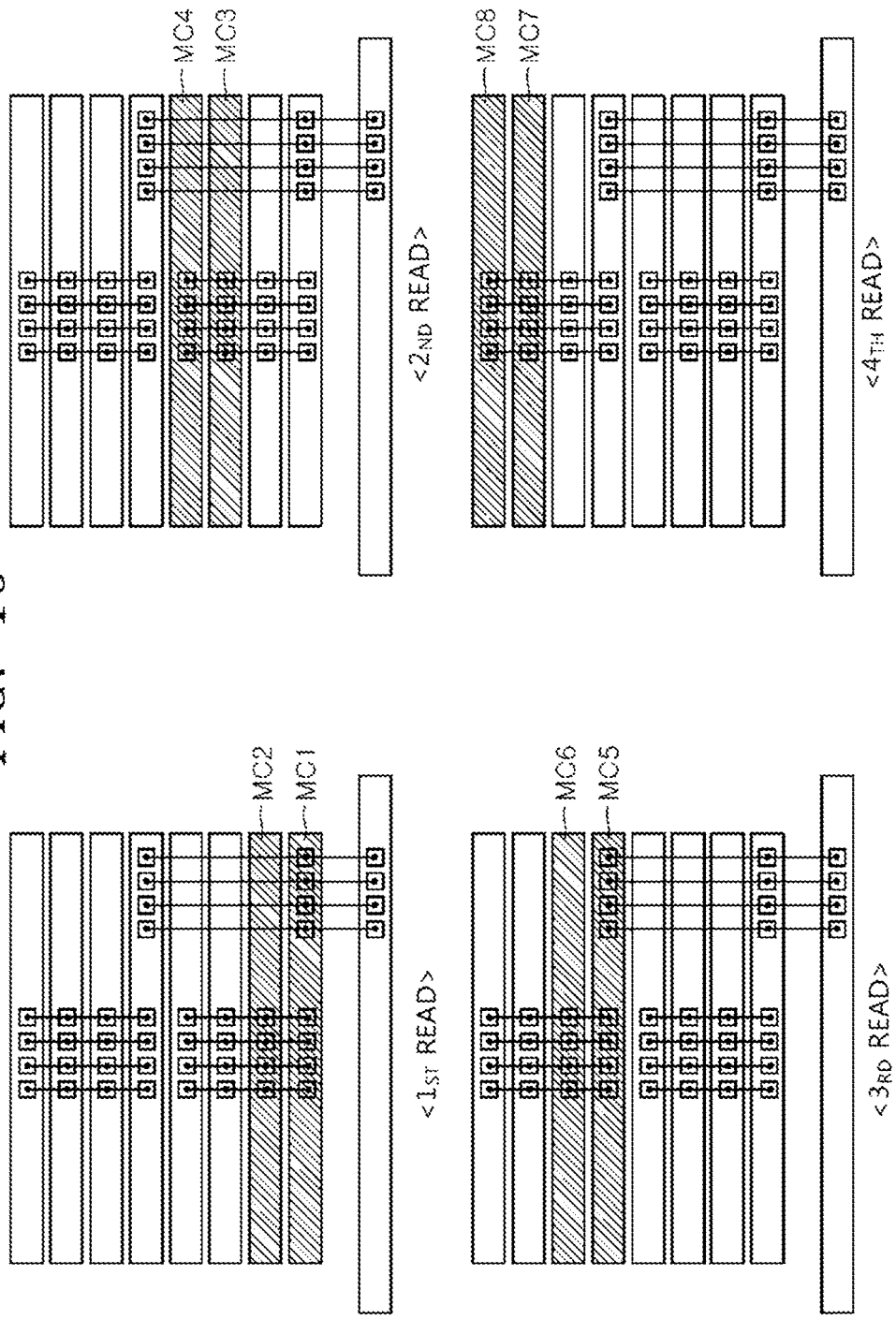

An operation performed in the first test mode of a semiconductor system according to an embodiment will be described hereinafter with reference to FIGS. 9 and 10 in conjunction with an example in which a logic level of the first chip identification CID<1> is changed into a logic "high" level.

First, an operation of testing the first and second memory chips MC1 and MC2 in the first test mode will be described hereinafter with reference to FIG. 9.

The first semiconductor device 1 may output the first to third chip identifications CID<1:3> having a first logic level combination. The first semiconductor device 1 may output the first test control signal TPX<1> having a logic "high" level. The first to third chip identifications CID<1:3> outputted from the first semiconductor device 1 may be sequentially counted to have various logic level combinations from the first logic level combination of 'L,L,L' to an eighth logic level combination of 'H,H,H'.

The ID creation circuit 10 of the first memory chip MC1 may change the first to third chip identifications CID<1:3> in response to the first and second test mode signals TM<1:2> having a logic "high" level and may output the changed chip identifications as the first to third internal identifications IID<1:3>. In such a case, the ID creation circuit 10 does not output the first to third internal identifications IID<1:3> as the first to third set identifications SID<1:3>. The ID creation circuit 10 may generate the first to third set identifications SID<1:3> having the same logic level combination as the first to third chip identifications CID<1:3> having the first logic level combination for activating the first memory chip MC1.

The output control circuit 20 of the first memory chip MC1 may receive the first set identification SID<1> having a logic "low" level to generate the first sub-control signal SCON<1> having a logic "high" level, the second sub-control signal SCON<2> having a logic "high" level, the third sub-control signal SCON<3> having a logic "low" level, and the fourth sub-control signal SCON<4> having a logic "low" level. The output control circuit 20 may receive the first set identification SID<1> having a logic "low" level and the second set identification SID<2> having a logic "low" level to generate the first main control signal MCON<1> having a logic "high" level, the second main control signal MCON<2> having a logic "high" level, the third main control signal MCON<3> having a logic "high" level, and the fourth main control signal MCON<4> having a logic "high" level.

The memory circuit 30 of the first memory chip MC1 may be activated in response to the first to third chip identifications CID<1:3> having the first logic level combination. The memory circuit 30 may perform the read operation to output the first to fourth internal data ID<1:4>. In such a case, the first to third chip identifications CID<1:3> may have a logic level combination of 'L,L,L' corresponding to the first logic level combination.

The data process circuit 40 of the first memory chip MC1 may output the first to fourth internal data ID<1:4> as the first to fourth transmission data TD<1:4>.

The data output circuit 50 of the first memory chip MC1 may generate the first output data DO<1> from the first transmission data TD<1> in response to the first sub-control signal SCON<1> having a logic "high" level. The data output circuit 50 may output the first output data DO<1> to the first sub-pad SP1. The data output circuit 50 may generate the second output data DO<2> from the second transmission data TD<2> in response to the second sub-control signal SCON<2> having a logic "high" level. The data output circuit 50 may output the second output data DO<2> to the second sub-pad SP2. The data output circuit 50 may generate the first external data ED<1> from the first output data DO<1> loaded on the first sub-pad SP1 in response to the first main control signal MCON<1> having a logic "high" level. The data output circuit 50 may output the first external data ED<1> to the first main pad MP1. The data output circuit 50 may generate the second external data ED<2> from the second output data DO<2> loaded on the second sub-pad SP2 in response to the second main control signal MCON<2> having a logic "high" level. The data output circuit 50 may output the second external data ED<2> to the second main pad MP2.

The ID creation circuit (not shown) of the second memory chip MC2 may change the first to third chip identifications CID<1:3> in response to the first and second test mode signals TM<1:2> having a logic "high" level and may output the changed chip identifications as the first to third internal identifications IID<1:3>. In such a case, the ID creation circuit (not shown) does not output the first to third internal identifications IID<1:3> as the first to third set identifications SID<1:3>. The ID creation circuit (not shown) may generate the first to third set identifications SID<1:3> having the same logic level combination as the first to third chip identifications CID<1:3> having the second logic level combination for activating the second memory chip MC2.

The output control circuit (not shown) of the second memory chip MC2 may receive the first set identification SID<1> having a logic "high" level to generate the first sub-control signal SCON<1> having a logic "low" level, the second sub-control signal SCON<2> having a logic "low" level, the third sub-control signal SCON<3> having a logic "high" level, and the fourth sub-control signal SCON<4> having a logic "high" level. The output control circuit (not shown) may receive the first set identification SID<1> having a logic "high" level and the second set identification SID<2> having a logic "low" level to generate the first main control signal MCON<1> having a logic "low" level, the second main control signal MCON<2> having a logic "low" level, the third main control signal MCON<3> having a logic "low" level, and the fourth main control signal MCON<4> having a logic "low" level.

The memory circuit (not shown) of the second memory chip MC2 may be activated in response to the first to third internal identifications IID<1:3> having the second logic level combination. The memory circuit (not shown) may perform the read operation to output the first to fourth internal data ID<1:4>. In such a case, the first to third internal identifications IID<1:3> may have a logic level combination of 'L,L,H' corresponding to the second logic level combination.

The data process circuit (not shown) of the second memory chip MC2 may output the first to fourth internal data ID<1:4> as the first to fourth transmission data TD<1:4>.

The data output circuit (not shown) of the second memory chip MC2 may generate the third output data DO<3> from the third transmission data TD<3> in response to the third sub-control signal SCON<3> having a logic "high" level. The data output circuit (not shown) may output the third output data DO<3> to the third sub-pad SP3. The data output circuit (not shown) may generate the fourth output data DO<4> from the fourth transmission data TD<4> in response to the fourth sub-control signal SCON<4> having a logic "high" level. The data output circuit (not shown) may output the fourth output data DO<4> to the fourth sub-pad SP4.

If the third output data DO<3> generated by the data output circuit (not shown) of the second memory chip MC2 is transmitted to the third sub-pad SP3, the data output circuit 50 of the first memory chip MC1 may generate the third external data ED<3> from the third output data DO<3> loaded on the third sub-pad SP3 in response to the third main control signal MCON<3> having a logic "high" level. The data output circuit 50 may output the third external data ED<3> to the third main pad MP3. In addition, if the fourth output data DO<4> generated by the data output circuit (not shown) of the second memory chip MC2 is transmitted to the fourth sub-pad SP4, the data output circuit 50 of the first memory chip MC1 may generate the fourth external data ED<4> from the fourth output data DO<4> loaded on the fourth sub-pad SP4 in response to the fourth main control signal MCON<4> having a logic "high" level. The data output circuit 50 may output the fourth external data ED<4> to the fourth main pad MP4.

The first semiconductor device 1 may receive the first to fourth eternal data ED<1:4> through the first to fourth data pads DP1~DP4 to evaluate whether the first and second memory chips MC1 and MC2 normally operate.

Subsequently, the third to eighth memory chips MC3~MC8 may also be tested using substantially the same way as described the above. Thus, descriptions of operations for testing the third to eighth memory chips MC3~MC8 will be omitted hereinafter.

Next, an operation of testing the first to eighth memory chips MC1~MC8 in the first test mode will be described hereinafter with reference to FIG. 10.

While a first read operation is performed, the first and second memory chips MC1 and MC2 may be simultaneously activated to perform the read operation. In such a case, the first semiconductor device 1 may receive the first and second external data ED<1:2> through the first and second data pads DP1 and DP2 to evaluate whether the first memory chip MC1 normally operates. The first semiconductor device 1 may receive the third and fourth external data ED<3:4> through the third and fourth data pads DP3 and DP4 to evaluate whether the second memory chip MC2 normally operates.

While a second read operation is performed, the third and fourth memory chips MC3 and MC4 may be simultaneously activated to perform the read operation. In such a case, the first semiconductor device 1 may receive the first and second external data ED<1:2> through the first and second data pads DP1 and DP2 to evaluate whether the third memory chip MC3 normally operates. The first semiconductor device 1 may receive the third and fourth external data ED<3:4> through the third and fourth data pads DP3 and DP4 to evaluate whether the fourth memory chip MC4 normally operates.

While a third read operation is performed, the fifth and sixth memory chips MC5 and MC6 may be simultaneously activated to perform the read operation. In such a case, the first semiconductor device 1 may receive the first and second external data ED<1:2> through the first and second data pads DP1 and DP2 to evaluate whether the fifth memory chip MC5 normally operates. The first semiconductor device 1 may receive the third and fourth external data ED<3:4> through the third and fourth data pads DP3 and DP4 to evaluate whether the sixth memory chip MC6 normally operates.

While a fourth read operation is performed, the seventh and eighth memory chips MC7 and MC8 may be simultaneously activated to perform the read operation. In such a case, the first semiconductor device 1 may receive the first and second external data ED<1:2> through the first and second data pads DP1 and DP2 to evaluate whether the seventh memory chip MC7 normally operates. The first semiconductor device 1 may receive the third and fourth external data ED<3:4> through the third and fourth data pads DP3 and DP4 to evaluate whether the eighth memory chip MC8 normally operates.

Figure 12:
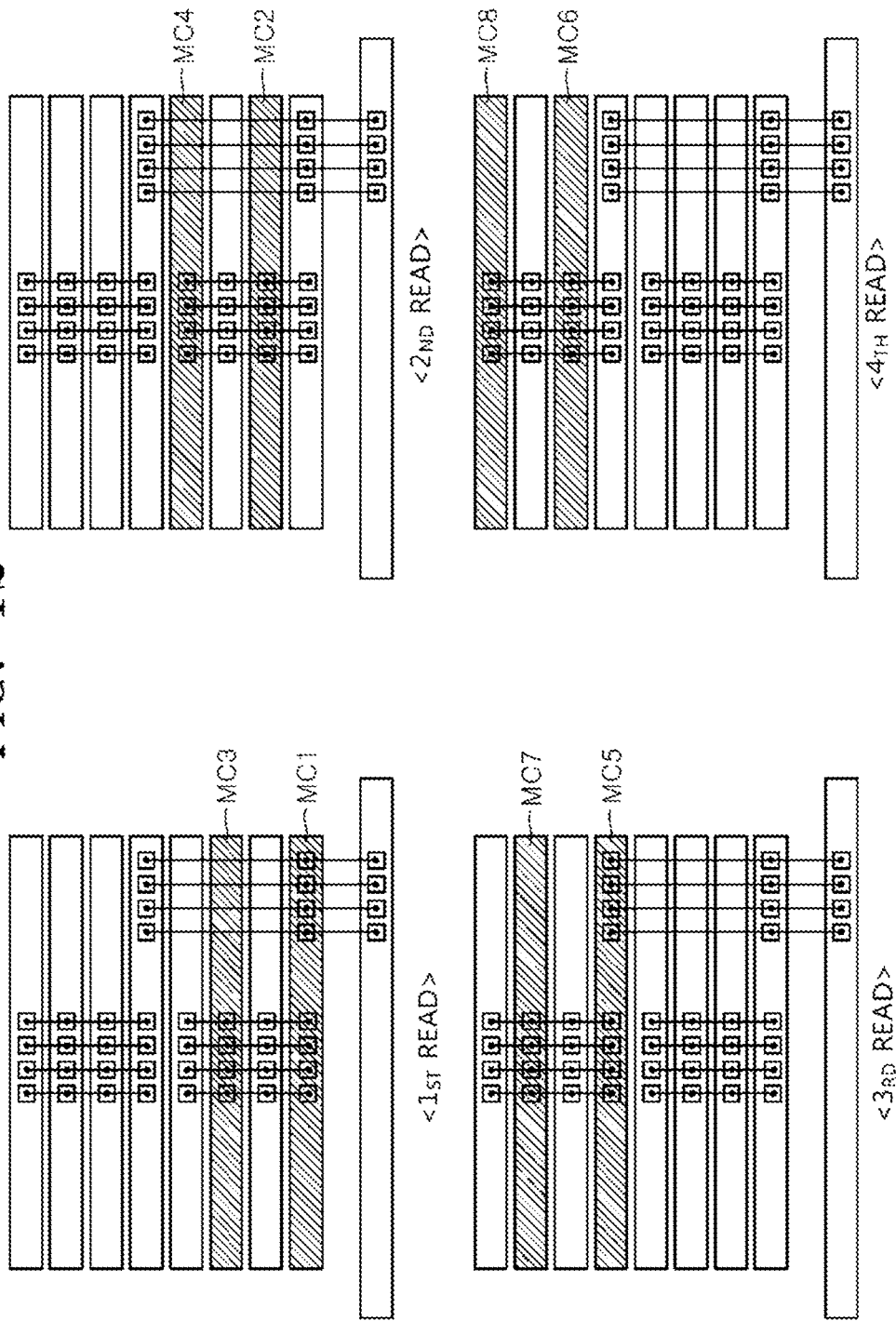

An operation performed in the second test mode of a semiconductor system according to an embodiment will be described hereinafter with reference to FIGS. 11 and 12 in conjunction with an example in which a logic level of the second chip identification CID<2> is changed into a logic "high" level.

First, an operation of testing the first and third memory chips MC1 and MC3 in the second test mode will be described hereinafter with reference to FIG. 11.

The first semiconductor device 1 may output the first to third chip identifications CID<1:3> having a first logic level combination. The first semiconductor device 1 may output the second test control signal TPX<2> having a logic "high" level. The first to third chip identifications CID<1:3> outputted from the first semiconductor device 1 may be sequentially counted to have various logic level combinations from the first logic level combination of 'L,L,L' to an eighth logic level combination of 'H,H,H'.

The ID creation circuit 10 of the first memory chip MC1 may change the first to third chip identifications CID<1:3> in response to the third and fourth test mode signals TM<3:4> having a logic "high" level and may output the changed chip identifications as the first to third internal identifications IID<1:3>. In such a case, the ID creation circuit 10 does not output the first to third internal identifications IID<1:3> as the first to third set identifications SID<1:3>. The ID creation circuit 10 may generate the first to third set identifications SID<1:3> having the same logic level combination as the first to third chip identifications CID<1:3> having the first logic level combination for activating the first memory chip MC1.

The output control circuit 20 of the first memory chip MC1 may receive the second set identification SID<2> having a logic "low" level to generate the first sub-control signal SCON<1> having a logic "high" level, the second sub-control signal SCON<2> having a logic "high" level, the third sub-control signal SCON<3> having a logic "low" level, and the fourth sub-control signal SCON<4> having a logic "low" level. The output control circuit 20 may receive the first set identification SID<1> having a logic "low" level and the second set identification SID<2> having a logic "low" level to generate the first main control signal MCON<1> having a logic "high" level, the second main control signal MCON<2> having a logic "high" level, the third main control signal MCON<3> having a logic "high" level, and the fourth main control signal MCON<4> having a logic "high" level.

The memory circuit 30 of the first memory chip MC1 may be activated in response to the first to third chip identifications CID<1:3> having the first logic level combination. The memory circuit 30 may perform the read operation to output the first to fourth internal data ID<1:4>. In such a case, the first to third chip identifications CID<1:3> may have a logic level combination of 'L,L,L' corresponding to the first logic level combination.

The data process circuit 40 of the first memory chip MC1 may output the first to fourth internal data ID<1:4> as the first to fourth transmission data TD<1:4>.

The data output circuit 50 of the first memory chip MC1 may generate the first output data DO<1> from the first transmission data TD<1> in response to the first sub-control signal SCON<1> having a logic "high" level. The data output circuit 50 may output the first output data DO<1> to the first sub-pad SP1. The data output circuit 50 may generate the second output data DO<2> from the second transmission data TD<2> in response to the second sub-control signal SCON<2> having a logic "high" level. The data output circuit 50 may output the second output data DO<2> to the second sub-pad SP2. The data output circuit 50 may generate the first external data ED<1> from the first output data DO<1> loaded on the first sub-pad SP1 in response to the first main control signal MCON<1> having a logic "high" level. The data output circuit 50 may output the first external data ED<1> to the first main pad MP1. The data output circuit 50 may generate the second external data ED<2> from the second output data DO<2> loaded on the second sub-pad SP2 in response to the second main control signal MCON<2> having a logic "high" level. The data output circuit 50 may output the second external data ED<2> to the second main pad MP2.

The ID creation circuit (not shown) of the third memory chip MC3 may change the first to third chip identifications CID<1:3> in response to the third and fourth test mode signals TM<3:4> having a logic "high" level and may output the changed chip identifications as the first to third internal identifications IID<1:3>. In such a case, the ID creation circuit (not shown) does not output the first to third internal identifications IID<1:3> as the first to third set identifications SID<1:3>. The ID creation circuit (not shown) may generate the first to third set identifications SID<1:3> having the same logic level combination as the first to third chip identifications CID<1:3> having the third logic level combination for activating the third memory chip MC3.

The output control circuit (not shown) of the third memory chip MC3 may receive the second set identification SID<2> having a logic "high" level to generate the first sub-control signal SCON<1> having a logic "low" level, the second sub-control signal SCON<2> having a logic "low" level, the third sub-control signal SCON<3> having a logic "high" level, and the fourth sub-control signal SCON<4> having a logic "high" level. The output control circuit (not shown) may receive the first set identification SID<1> having a logic "low" level and the second set identification SID<2> having a logic "high" level to generate the first main control signal MCON<1> having a logic "low" level, the second main control signal MCON<2> having a logic "low" level, the third main control signal MCON<3> having a logic "low" level, and the fourth main control signal MCON<4> having a logic "low" level.

The memory circuit (not shown) of the third memory chip MC3 may be activated in response to the first to third internal identifications IID<1:3> having the third logic level combination. The memory circuit (not shown) may perform the read operation to output the first to fourth internal data ID<1:4>. In such a case, the first to third internal identifications IID<1:3> may have a logic level combination of 'L,H,L' corresponding to the third logic level combination.

The data process circuit (not shown) of the third memory chip MC3 may output the first to fourth internal data ID<1:4> as the first to fourth transmission data TD<1:4>.

The data output circuit (not shown) of the third memory chip MC3 may generate the third output data DO<3> from the third transmission data TD<3> in response to the third sub-control signal SCON<3> having a logic "high" level. The data output circuit (not shown) may output the third output data DO<3> to the third sub-pad SP3. The data output circuit (not shown) may generate the fourth output data DO<4> from the fourth transmission data TD<4> in response to the fourth sub-control signal SCON<4> having a logic "high" level. The data output circuit (not shown) may output the fourth output data DO<4> to the fourth sub-pad SP4.

If the third output data DO<3> generated by the data output circuit (not shown) of the third memory chip MC3 is transmitted to the third sub-pad SP3, the data output circuit 50 of the first memory chip MC1 may generate the third external data ED<3> from the third output data DO<3> loaded on the third sub-pad SP3 in response to the third main control signal MCON<3> having a logic "high" level. The data output circuit 50 may output the third external data ED<3> to the third main pad MP3. In addition, if the fourth output data DO<4> generated by the data output circuit (not shown) of the third memory chip MC3 is transmitted to the fourth sub-pad SP4, the data output circuit 50 of the first memory chip MC1 may generate the fourth external data ED<4> from the fourth output data DO<4> loaded on the fourth sub-pad SP4 in response to the fourth main control signal MCON<4> having a logic "high" level. The data output circuit 50 may output the fourth external data ED<4> to the fourth main pad MP4.

The first semiconductor device 1 may receive the first to fourth eternal data ED<1:4> through the first to fourth data pads DP1~DP4 to evaluate whether the first and third memory chips MC1 and MC3 normally operate.

Subsequently, the second memory chip MC2 and the fourth to eighth memory chips MC4~MC8 may also be tested using substantially the same way as described the above. Thus, detailed descriptions of operations for testing the second memory chip MC2 and the fourth to eighth memory chips MC4~MC8 will be omitted hereinafter.

Next, an operation of testing the first to eighth memory chips MC1~MC8 in the second test mode will be described hereinafter with reference to FIG. 12.

While a first read operation is performed, the first and third memory chips MC1 and MC3 may be simultaneously activated to perform the read operation. In such a case, the first semiconductor device 1 may receive the first and second external data ED<1:2> through the first and second data pads DP1 and DP2 to evaluate whether the first memory chip MC1 normally operates. The first semiconductor device 1 may receive the third and fourth external data ED<3:4> through the third and fourth data pads DP3 and DP4 to evaluate whether the third memory chip MC3 normally operates.

While a second read operation is performed, the second and fourth memory chips MC2 and MC4 may be simultaneously activated to perform the read operation. In such a case, the first semiconductor device 1 may receive the first and second external data ED<1:2> through the first and second data pads DP1 and DP2 to evaluate whether the second memory chip MC2 normally operates. The first semiconductor device 1 may receive the third and fourth external data ED<3:4> through the third and fourth data pads DP3 and DP4 to evaluate whether the fourth memory chip MC4 normally operates.

While a third read operation is performed, the fifth and seventh memory chips MC5 and MC7 may be simultaneously activated to perform the read operation. In such a case, the first semiconductor device 1 may receive the first and second external data ED<1:2> through the first and second data pads DP1 and DP2 to evaluate whether the fifth memory chip MC5 normally operates. The first semiconductor device 1 may receive the third and fourth external data ED<3:4> through the third and fourth data pads DP3 and DP4 to evaluate whether the seventh memory chip MC7 normally operates.

While a fourth read operation is performed, the sixth and eighth memory chips MC6 and MC8 may be simultaneously activated to perform the read operation. In such a case, the first semiconductor device 1 may receive the first and second external data ED<1:2> through the first and second data pads DP1 and DP2 to evaluate whether the sixth memory chip MC6 normally operates. The first semiconductor device 1 may receive the third and fourth external data ED<3:4> through the third and fourth data pads DP3 and DP4 to evaluate whether the eighth memory chip MC8 normally operates.

Figure 14:
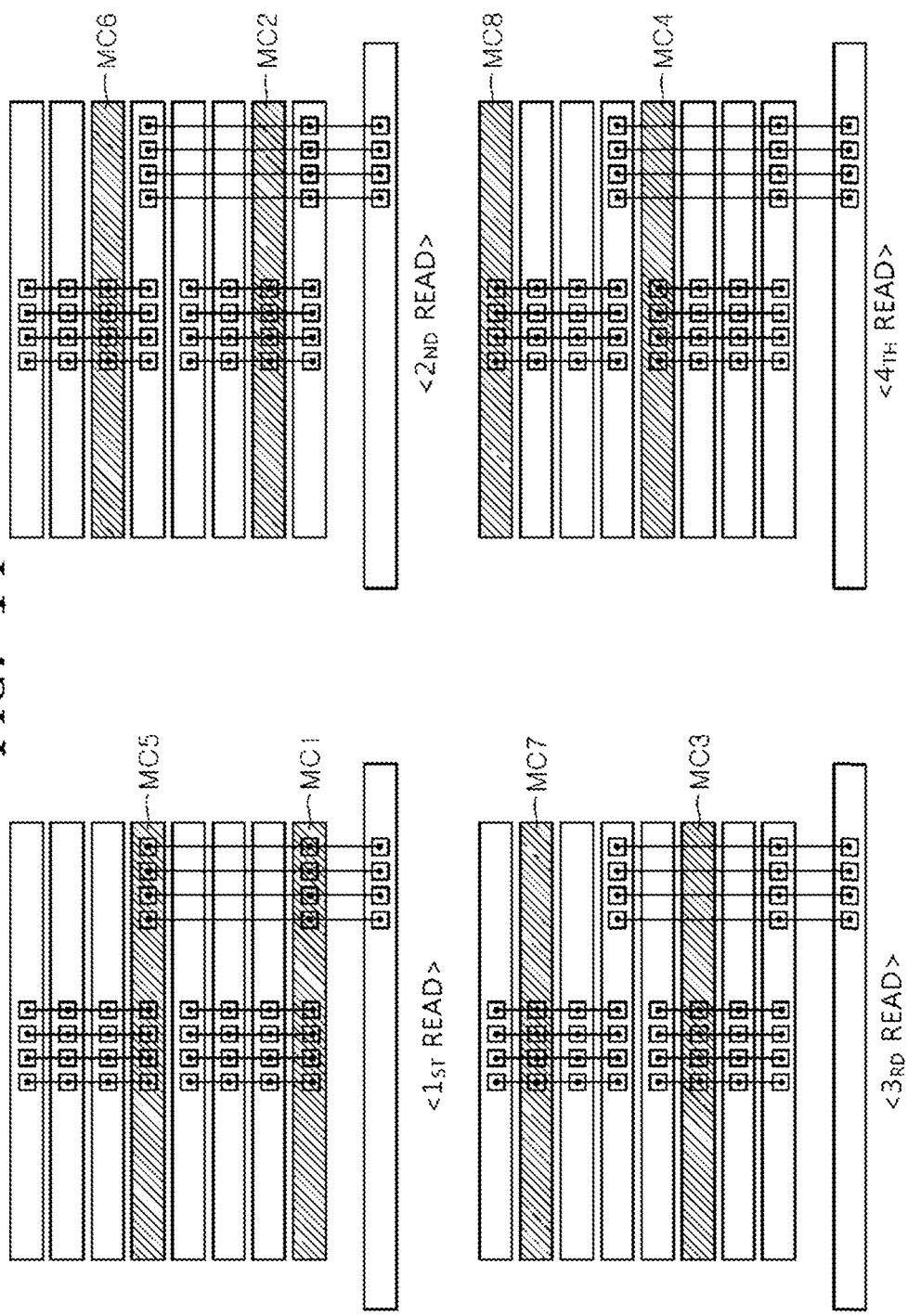

An operation performed in the third test mode of a semiconductor system according to an embodiment will be described hereinafter with reference to FIGS. 13 and 14 in conjunction with an example in which a logic level of the third chip identification CID<3> is changed into a logic "high" level.

First, an operation of testing the first and fifth memory chips MC1 and MC5 in the third test mode will be described hereinafter with reference to FIG. 13.

The first semiconductor device 1 may output the first to third chip identifications CID<1:3> having a first logic level combination. The first semiconductor device 1 may output the third test control signal TPX<3> having a logic "high" level. The first to third chip identifications CID<1:3> outputted from the first semiconductor device 1 may be sequentially counted to have various logic level combinations from the first logic level combination of 'L,L,L' to an eighth logic level combination of 'H,H,H'.

The ID creation circuit 10 of the first memory chip MC1 may change the first to third chip identifications CID<1:3> in response to the fifth and sixth test mode signals TM<5:6> having a logic "high" level and may output the changed chip identifications as the first to third internal identifications IID<1:3>. In such a case, the ID creation circuit 10 does not output the first to third internal identifications IID<1:3> as the first to third set identifications SID<1:3>. The ID creation circuit 10 may generate the first to third set identifications SID<1:3> having the same logic level combination as the first to third chip identifications CID<1:3> having the first logic level combination for activating the first memory chip MC1.

The output control circuit 20 of the first memory chip MC1 may receive the first and second test control signals TPX<1:2> having a logic "low" level to generate the reset signal RST having a logic "high" level. The output control circuit 20 may generate the first to fourth sub-control signals SCON<1:4> having a logic "high" level in response to the reset signal RST having a logic "high" level. The output control circuit 20 may generate the first and second main control signals MCON<1:2> having a logic "high" level and the third and fourth main control signals MCON<3:4> having a logic "low" level in response to the third test control signal TPX<3> having a logic "high" level and the second set identification SID<2> having a logic "low" level.

The memory circuit 30 of the first memory chip MC1 may be activated in response to the first to third chip identifications CID<1:3> having the first logic level combination. The memory circuit 30 may perform the read operation to output the first to fourth internal data ID<1:4>. In such a case, the first to third chip identifications CID<1:3> may have a logic level combination of 'L,L,L' corresponding to the first logic level combination.

The data process circuit 40 of the first memory chip MC1 may output the first to fourth internal data ID<1:4> as the first to fourth transmission data TD<1:4>.

The data output circuit 50 of the first memory chip MC1 may generate the first output data DO<1> from the first transmission data TD<1> in response to the first sub-control signal SCON<1> having a logic "high" level. The data output circuit 50 may output the first output data DO<1> to the first sub-pad SP1. The data output circuit 50 may generate the second output data DO<2> from the second transmission data TD<2> in response to the second sub-control signal SCON<2> having a logic "high" level. The data output circuit 50 may output the second output data DO<2> to the second sub-pad SP2. The data output circuit 50 may generate the third output data DO<3> from the third transmission data TD<3> in response to the third sub-control signal SCON<3> having a logic "high" level. The data output circuit 50 may output the third output data DO<3> to the third sub-pad SP3. The data output circuit 50 may generate the fourth output data DO<4> from the fourth transmission data TD<4> in response to the fourth sub-control signal SCON<4> having a logic "high" level. The data output circuit 50 may output the fourth output data DO<4> to the fourth sub-pad SP4. The data output circuit 50 may generate the first external data ED<1> from the first output data DO<1> loaded on the first sub-pad SP1 in response to the first main control signal MCON<1> having a logic "high" level. The data output circuit 50 may output the first external data ED<1> to the first main pad MP1. The data output circuit 50 may generate the second external data ED<2> from the second output data DO<2> loaded on the second sub-pad SP2 in response to the second main control signal MCON<2> having a logic "high" level. The data output circuit 50 may output the second external data ED<2> to the second main pad MP2.

The ID creation circuit (not shown) of the fifth memory chip MC5 may change the first to third chip identifications CID<1:3> in response to the fifth and sixth test mode signals TM<5:6> having a logic "high" level and may output the changed chip identifications as the first to third internal identifications IID<1:3>. In such a case, the ID creation circuit (not shown) does not output the first to third internal identifications IID<1:3> as the first to third set identifications SID<1:3>. The ID creation circuit (not shown) may generate the first to third set identifications SID<1:3> having the same logic level combination as the first to third chip identifications CID<1:3> having the fifth logic level combination for activating the fifth memory chip MC5.

The output control circuit (not shown) of the fifth memory chip MC5 may receive the first and second test control signals TPX<1:2> having a logic "low" level to generate the reset signal RST having a logic "high" level. The output control circuit (not shown) may generate the first to fourth sub-control signals SCON<1:4> having a logic "high" level in response to the reset signal RST having a logic "high" level. The output control circuit (not shown) may generate the first and second main control signals MCON<1:2> having a logic "low" level and the third and fourth main control signals MCON<3:4> having a logic "high" level in response to the third test control signal TPX<3> having a logic "high" level and the second set identification SID<2> having a logic "high" level.

The memory circuit (not shown) of the fifth memory chip MC5 may be activated in response to the first to third internal identifications IID<1:3> having the fifth logic level combination. The memory circuit (not shown) may perform the read operation to output the first to fourth internal data ID<1:4>. In such a case, the first to third internal identifications IID<1:3> may have a logic level combination of 'H,L,L' corresponding to the fifth logic level combination.

The data process circuit (not shown) of the fifth memory chip MC5 may output the first to fourth internal data ID<1:4> as the first to fourth transmission data TD<1:4>.

The data output circuit (not shown) of the fifth memory chip MC5 may generate the third external data ED<3> from the third output data DO<3> loaded on the third sub-pad SP3 in response to the third main control signal MCON<3> having a logic "high" level. The data output circuit (not shown) may output the third external data ED<3> to the third main pad MP3. The data output circuit (not shown) of the fifth memory chip MC5 may generate the fourth external data ED<4> from the fourth output data DO<4> loaded on the fourth sub-pad SP4 in response to the fourth main control signal MCON<4> having a logic "high" level. The data output circuit (not shown) may output the fourth external data ED<4> to the fourth main pad MP4.

The first semiconductor device 1 may receive the first to fourth eternal data ED<1:4> through the first to fourth data pads DP1~DP4 to evaluate whether the first and fifth memory chips MC1 and MC5 normally operate.

Subsequently, the second to fourth memory chips MC2~MC4 and the sixth to eighth memory chips MC6~MC8 may also be tested using substantially the same way as the operation of testing the first and fifth memory chips MC1 and MC5. Thus, detailed descriptions of operations for testing the second to fourth memory chips MC2~MC4 and the sixth to eighth memory chips MC6~MC8 will be omitted hereinafter.

Next, an operation of testing the first to eighth memory chips MC1~MC8 in the third test mode will be described hereinafter with reference to FIG. 14.

While a first read operation is performed, the first and fifth memory chips MC1 and MC5 may be simultaneously activated to perform the read operation. In such a case, the first semiconductor device 1 may receive the first and second external data ED<1:2> through the first and second data pads DP1 and DP2 to evaluate whether the first memory chip MC1 normally operates. The first semiconductor device 1 may receive the third and fourth external data ED<3:4> through the third and fourth data pads DP3 and DP4 to evaluate whether the fifth memory chip MC5 normally operates.

While a second read operation is performed, the second and sixth memory chips MC2 and MC6 may be simultaneously activated to perform the read operation. In such a case, the first semiconductor device 1 may receive the first and second external data ED<1:2> through the first and second data pads DP1 and DP2 to evaluate whether the second memory chip MC2 normally operates. The first semiconductor device 1 may receive the third and fourth external data ED<3:4> through the third and fourth data pads DP3 and DP4 to evaluate whether the sixth memory chip MC6 normally operates.

While a third read operation is performed, the third and seventh memory chips MC3 and MC7 may be simultaneously activated to perform the read operation. In such a case, the first semiconductor device 1 may receive the first and second external data ED<1:2> through the first and second data pads DP1 and DP2 to evaluate whether the third memory chip MC3 normally operates. The first semiconductor device 1 may receive the third and fourth external data ED<3:4> through the third and fourth data pads DP3 and DP4 to evaluate whether the seventh memory chip MC7 normally operates.

While a fourth read operation is performed, the fourth and eighth memory chips MC4 and MC8 may be simultaneously activated to perform the read operation. In such a case, the first semiconductor device 1 may receive the first and second external data ED<1:2> through the first and second data pads DP1 and DP2 to evaluate whether the fourth memory chip MC4 normally operates. The first semiconductor device 1 may receive the third and fourth external data ED<3:4> through the third and fourth data pads DP3 and DP4 to evaluate whether the eighth memory chip MC8 normally operates. In some embodiments, the read operation being performed on the memory chip from any one among the first group of memory chips (i.e., MC1) has a same position (i.e., first chip position) in the memory chip stack for the first group (i.e., MC1-MC4) as the read operation being performed on the memory chip (i.e., MC5) from any one among the second group of memory chips has (i.e., first chip position) for the second group (i.e., MC5-MC8). In other embodiments, the read operation being performed on the memory chip from any one among the first group of memory chips (i.e., MC1) has a different position (i.e., first chip position) in the memory chip stack for the first group (i.e., MC1-MC4) than the read operation being performed on the memory chip (i.e., MC6) from any one among the second group of memory chips has (i.e., second chip position) for the second group (i.e., MC5-MC8).

As described above, a semiconductor system according to an embodiment may operate in a test mode changing a chip identification and may activate at least two of a plurality of memory chips included in the semiconductor system in the test mode to perform a compressive parallel test. As a result, the test time of the plurality of memory chips may be reduced.

Figure 15:
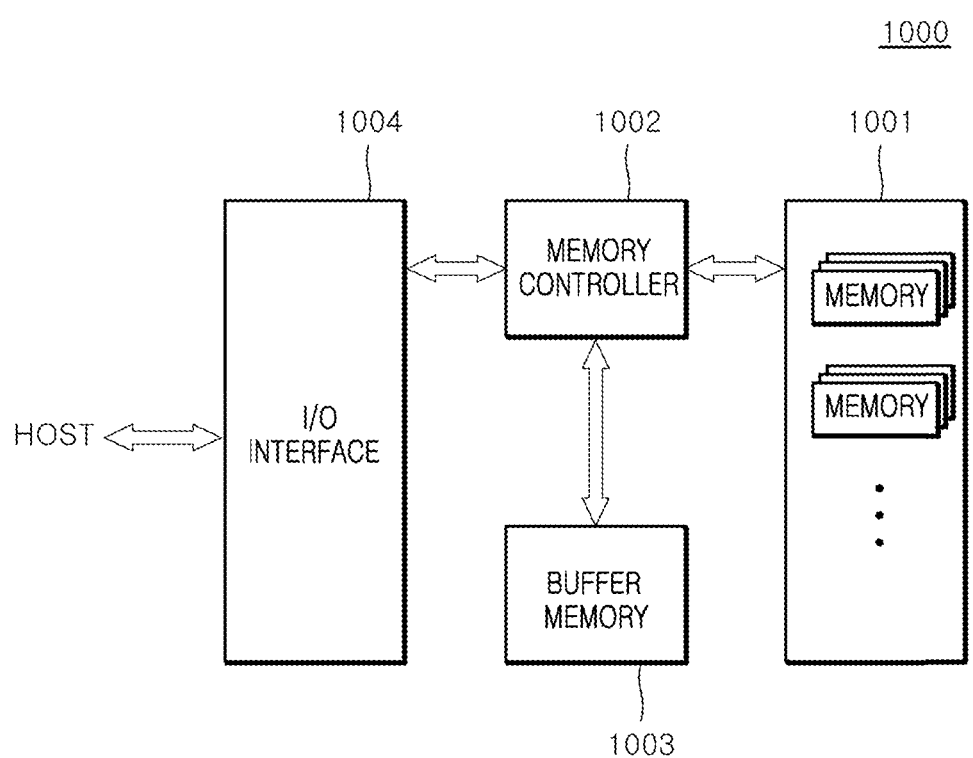
FIG. 15 is a block diagram illustrating an electronic system including at least one of the semiconductor devices or the semiconductor systems illustrated in FIGS. 1 to 10.

The semiconductor system described with reference to FIGS. 1 to 14 may be applied to an electronic system that includes a memory system, a graphic system, a computing system, a mobile system, or the like. For example, as illustrated in FIG. 15, an electronic system 1000 according an embodiment may include a data storage unit 1001, a memory controller 1002, a buffer memory 1003 and an input/output (I/O) interface 1004.

The data storage unit 1001 may store data which are outputted from the memory controller 1002 or may read and output the stored data to the memory controller 1002, according to a control signal generated from the memory controller 1002. The data storage unit 1001 may include the second semiconductor devices 2 illustrated in FIG. 1. Meanwhile, the data storage unit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage unit 1001 or the buffer memory 1003 or for outputting the data stored in the data storage unit 1001 or the buffer memory 1003. The memory controller 1002 may include the first semiconductor devices 1 illustrated in FIG. 1. Although FIG. 15 illustrates the memory controller 1002 with a single block, the memory controller 1002 may include one controller for controlling the data storage unit 1001 comprised of a nonvolatile memory and another controller for controlling the buffer memory 1003 comprised of a volatile memory.

The buffer memory 1003 may temporarily store the data to be processed by the memory controller 1002. That is, the buffer memory 1003 may temporarily store the data which are outputted from or to be inputted to the data storage unit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor system comprising:
   a first semiconductor device configured to control a test mode, configured to output a chip identification, and configured to receive external data; and
   a second semiconductor device configured to include a plurality of memory chips,
   wherein the chip identification is changed in response to a test mode signal,
   wherein, while a write operation is performed in the test mode, two or more memory chips from the plurality of memory chips are activated based on the chip identification changed to store input data into each of the plurality of memory chips that have been activated,
   wherein at least two of the plurality of memory chips are activated in response to the chip identification changed to output the stored input data as the external data while a read operation is performed in the test mode, and wherein the test mode is an operation for testing a normal operation of memory chips immediately adjacent to each other between the two or more memory chips or an operation for testing the normal operation of the two or more memory chips separated from each other.

2. The semiconductor system of claim 1, wherein the external data outputted from the second semiconductor device during the read operation include information on whether the plurality of memory chips normally operate.

3. The semiconductor system of claim 1,
wherein the test mode includes a first test mode, a second test mode, and a third test mode;
wherein the plurality of memory chips include a first group of memory chips stacked on the first semiconductor device and a second group of memory chips stacked on the first group of memory chips;
wherein the read operation for two memory chips immediately adjacent to each other among the first group of memory chips or among the second group of memory chips is performed in the first test mode;
wherein the read operation for two memory chips separated from each other by at least one memory chip among the first group of memory chips or among the second group of memory chips is performed in the second test mode; and
wherein the read operation for any one among the first group of memory chips and for any one among the second group of memory chips is performed in the third test mode.

4. The semiconductor system of claim 3,
wherein the external data include first external data and second external data; and
wherein one of the two memory chips performing the read operation in the first or second test mode outputs the input data stored therein as the first external data, and the other of the two memory chips performing the read operation in the first or second test mode outputs the input data stored therein as the second external data.

5. The semiconductor system of claim 3,
wherein the external data include first external data and second external data; and
wherein one of the first group of memory chips, which performs the read operation in the third test mode, outputs the input data stored therein as the first external data; and
wherein one of the second group of memory chips, which performs the read operation in the third test mode, outputs the input data stored therein as the second external data.

6. The semiconductor system of claim 1,
wherein the external data include first external data and second external data;
wherein the plurality of memory chips include a first group of memory chips and a second group of memory chips;
wherein the first group of memory chips include first and second memory chips, each of the first and second memory chips stores the input data during the write operation, and the input data stored in any one selected from the first and second memory chips according to a logic level combination of the chip identification is outputted as the first external data based on a test control signal during the read operation; and
wherein the second group of memory chips include third and fourth memory chips, each of the third and fourth memory chips stores the input data during the write operation, and the input data stored in any one selected from the third and fourth memory chips according to a logic level combination of the chip identification is outputted as the second external data based on the test control signal during the read operation.

7. The semiconductor system of claim 6,
wherein the first and second memory chips are connected through a first sub-pad;
wherein the third and fourth memory chips are connected through a second sub-pad; and
wherein the first memory chip and the third memory chip are connected through a main pad.

8. The semiconductor system of claim 6, wherein the first to fourth memory chips are sequentially stacked.

* * * * *